United States Patent
Zhu

(10) Patent No.: US 9,735,287 B2
(45) Date of Patent: Aug. 15, 2017

(54) MEMORY DEVICES, METHODS OF MANUFACTURING THE SAME, AND METHODS OF ACCESSING THE SAME

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/888,651

(22) PCT Filed: May 30, 2013

(86) PCT No.: PCT/CN2013/076482
§ 371 (c)(1),
(2) Date: Nov. 2, 2015

(87) PCT Pub. No.: WO2014/176807
PCT Pub. Date: Nov. 6, 2014

(65) Prior Publication Data
US 2016/0104801 A1    Apr. 14, 2016

(30) Foreign Application Priority Data
May 3, 2013 (CN) .......................... 2013 1 0160970

(51) Int. Cl.
*H01L 29/788* (2006.01)
*G11C 16/10* (2006.01)
(Continued)

(52) U.S. Cl.
CPC .......... *H01L 29/7883* (2013.01); *G11C 16/10* (2013.01); *G11C 16/24* (2013.01);
(Continued)

(58) Field of Classification Search
CPC ............. H01L 29/7883; H01L 29/7781; H01L 29/66795; H01L 29/7855; H01L 29/7848;
(Continued)

(56) References Cited

U.S. PATENT DOCUMENTS 4,979,004 A * 12/1990 Esquivel ............... H01L 27/115
257/316
7,087,966 B1 * 8/2006 Anderson ......... H01L 29/42384
257/213
(Continued)

FOREIGN PATENT DOCUMENTS

| CN | 101068029 A | 11/2007 |
|----|-------------|---------|
| CN | 102569396 A | 7/2012  |

OTHER PUBLICATIONS

International Search Report from related International Patent Application No. PCT/CN2013/076482, dated Jan. 30, 2014.

*Primary Examiner* — Vu Le
*Assistant Examiner* — Sung Cho
(74) *Attorney, Agent, or Firm* — McDermott Will & Emery LLP

(57) ABSTRACT

Memory devices, methods of manufacturing the same, and methods of accessing the same are provided. In one embodiment, the memory device may include a substrate, a back gate formed on the substrate, and a transistor. The transistor may include fins formed on opposite sides of the back gate on the substrate and a gate stack formed on the substrate and intersecting the fins. The memory device may further include a back gate dielectric layer formed on side and bottom surfaces of the back gate. The back gate dielectric layer may have a thickness reduced portion at a region facing the fins on one side of the gate stack.

24 Claims, 19 Drawing Sheets

(51) Int. Cl.
| | |
|---|---|
| *H01L 29/778* | (2006.01) |
| *H01L 29/66* | (2006.01) |
| *H01L 29/78* | (2006.01) |
| *G11C 16/24* | (2006.01) |
| *H01L 29/06* | (2006.01) |
| *H01L 29/16* | (2006.01) |
| *H01L 29/161* | (2006.01) |
| *H01L 29/20* | (2006.01) |
| *H01L 27/11521* | (2017.01) |
| *H01L 29/165* | (2006.01) |

(52) U.S. Cl.
CPC ...... *H01L 29/0638* (2013.01); *H01L 29/0653* (2013.01); *H01L 29/16* (2013.01); *H01L 29/161* (2013.01); *H01L 29/1608* (2013.01); *H01L 29/20* (2013.01); *H01L 29/2003* (2013.01); *H01L 29/66537* (2013.01); *H01L 29/66795* (2013.01); *H01L 29/66825* (2013.01); *H01L 29/7781* (2013.01); *H01L 29/7848* (2013.01); *H01L 29/7855* (2013.01); *H01L 27/11521* (2013.01); *H01L 29/165* (2013.01)

(58) Field of Classification Search
CPC . H01L 29/0638; H01L 29/0653; H01L 29/16; H01L 29/1608; H01L 29/161; H01L 29/20; H01L 29/2003; H01L 29/66537; H01L 29/66825; H01L 29/165; H01L 27/11521; G11C 16/10; G11C 16/24
USPC ............. 365/185.21; 257/314, 315, 347; 438/201, 211, 257, 593, 283, 157
See application file for complete search history.

(56) References Cited

U.S. PATENT DOCUMENTS

| | | | |
|---|---|---|---|
| 8,981,454 B2 * | 3/2015 | Zhu | H01L 21/28273 257/315 |
| 2003/0178670 A1 * | 9/2003 | Fried | H01L 21/28273 257/315 |
| 2005/0014318 A1 | 1/2005 | Manger | |
| 2005/0073005 A1 * | 4/2005 | Nowak | H01L 21/84 257/347 |
| 2005/0245009 A1 * | 11/2005 | Bryant | H01L 29/42368 438/151 |
| 2005/0254302 A1 * | 11/2005 | Noguchi | G11C 16/08 365/185.17 |
| 2006/0286724 A1 * | 12/2006 | Anderson | H01L 29/785 438/149 |
| 2006/0292772 A1 * | 12/2006 | Anderson | H01L 21/82341 438/197 |
| 2007/0259501 A1 * | 11/2007 | Xiong | H01L 21/845 438/283 |
| 2009/0206405 A1 | 8/2009 | Doyle et al. | |
| 2010/0252874 A1 * | 10/2010 | Schulz | H01L 21/28273 257/315 |
| 2013/0102116 A1 * | 4/2013 | Xiao | H01L 21/782 438/157 |
| 2014/0097483 A1 * | 4/2014 | Wang | H01L 27/1156 257/318 |
| 2014/0264541 A1 * | 9/2014 | Rhie | H01L 29/792 257/324 |
| 2015/0162339 A1 * | 6/2015 | Divakaruni | H01L 21/0234 257/321 |

* cited by examiner

MEMORY DEVICES, METHODS OF MANUFACTURING THE SAME, AND METHODS OF ACCESSING THE SAME

CROSS-REFERENCE TO RELATED APPLICATION(S)

This application is a U.S. national phase application of PCT Application No. PCT/CN2013/076482, filed on May 30, 2013, entitled "STORAGE DEVICE, AND MANUFACTURING METHOD AND ACCESS METHOD THEREOF," which claims priority to Chinese Application No. 201310160970.3, filed on May 3, 2013. Both the PCT Application and the Chinese Application are incorporated herein by reference in their entireties.

TECHNICAL FIELD

The present disclosure relates to the semiconductor field, and particularly, to memory devices, methods of manufacturing the same, and methods of accessing the same.

BACKGROUND

Flash memory devices in a floating-gate transistor configuration are commonly used. However, less and less charges can be stored in a floating gate with continuous scaling down of the devices. This causes fluctuations in threshold voltages of the devices and thus errors. In addition, the floating-gate transistor configuration needs two gate dielectric layers, which impedes further scaling down because the gate dielectric layers has a relatively great thickness in total.

SUMMARY

The present disclosure provides, among others, memory devices, methods of manufacturing the same, and methods of accessing the same.

According to an aspect of the present disclosure, there is provided a memory device, comprising: a substrate; a back gate formed on the substrate; a transistor, comprising fins formed on opposite sides of the back gate on the substrate and a gate stack formed on the substrate and intersecting the fins; and a back gate dielectric layer formed on side and bottom surfaces of the back gate, wherein the back gate dielectric layer has a thickness reduced portion at a region facing the fins on one side of the gate stack.

According to a further aspect of the present disclosure, there is provided a method of manufacturing a memory device, comprising: forming a back gate groove in a substrate; forming a back gate dielectric layer on side and bottom walls of the back gate groove; forming a back gate by filling a conductive material into the back gate groove; exposing a portion of the back gate dielectric layer by selectively removing a portion of the back gate at one end of the back gate groove, reducing the exposed portion of the back gate dielectric layer in thickness, and then refilling a further conductive material into the back gate groove; forming fins abutting the back gate dielectric layer by patterning the substrate; and forming a gate stack on the substrate to intersect the fins, wherein the portion of the back gate dielectric layer which is reduced in thickness is disposed on one side of the gate stack and faces the fins.

According to a still further aspect of the present disclosure, there is provided a method of accessing the above memory device, comprising: applying an ON voltage through a word line to turn on the transistor, electrically floating a drain of the transistor, and applying a first bias to a source of the transistor through a bit line, so that carriers flow from the source to the drain and tunnel into and thus are stored in the back gate through the thickness reduced portion of the back gate dielectric layer, to store a first state in the memory device; and applying the ON voltage through the word line to turn on the transistor, electrically floating the drain of the transistor, and applying a second bias to the source of the transistor through the bit line, so that the carriers stored in the back gate tunnel through the thickness reduced portion of the back gate dielectric layer and thus are released, to store a second state in the memory device, wherein the transistor has a threshold voltage in the first state different from that in the second state.

According to embodiments of the present disclosure, the back gate is interposed between the fins, resulting in a sandwich Fin (which is referred to in brief as sFin) configuration. Based on the sFin configuration, a sandwich Fin Field Effect Transistor (sFinFET) can be made. During manufacture of the sFinFET, the back gate can serve as a support for the fins, resulting in an improved reliability. The back gate may be electrically floated, and thus can serve as a floating gate, resulting in a sFinFET with a floating (back) gate. Such a sFinFET with a floating (back) gate may be adopted in a memory device such as a flash memory.

Further, the floating (back) gate may have a relatively large volume (especially, with respect to a floating gate in a conventional floating-gate transistor configuration), and thus can suppress fluctuations of charges stored therein to improve the reliability of the memory device.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
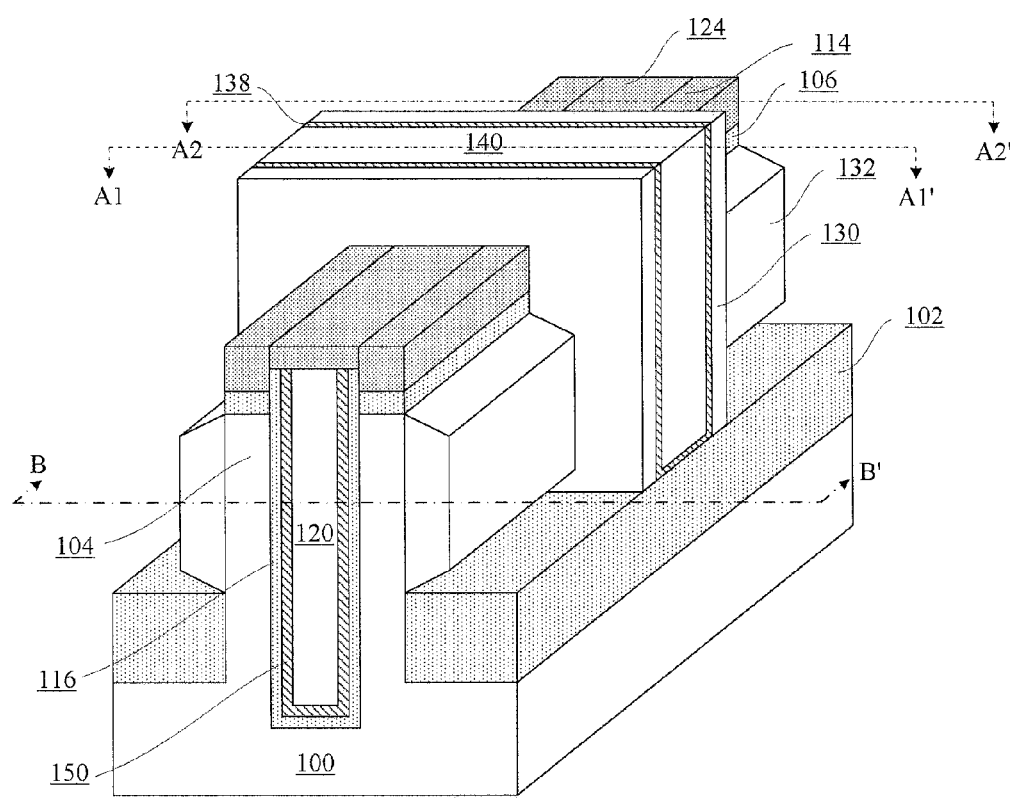
FIG. 1 is a perspective view showing a memory device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a memory device. The memory device may comprise a transistor in a floating-gate configuration, wherein a back gate serves as a floating gate. In an example, the transistor may comprise fins formed on opposite sides of the back gate on a substrate. Thus, the back gate and the fins constitute a sandwich Fin (sFin) configuration. The transistor may further comprise a gate stack formed on the substrate and intersecting the fins (and also the back gate disposed therebetween). As a result, this transistor can be configured as a sFinFET. The gate stack defines a channel region (corresponding to a portion of each of the fins intersecting the gate stack) and thus source/drain regions (at least partially formed in portions of each of the fins on opposite sides of the channel region, and optionally further comprising a semiconductor layer grown on surfaces of the fins as described in the following) in each of the fins. To avoid interference between the gate stack and the back gate, there may be a dielectric layer disposed therebetween for electrical isolation.

Further, a back gate dielectric layer may be formed on side and bottom surfaces of the back gate. The back gate dielectric layer may have a thickness reduced portion at a region facing the fins on one side of the gate stack. That is, at least a portion of the back gate dielectric layer in this region may have a thickness less than that of the remaining portion of the back gate dielectric layer. Carriers (for example, electrons for an n-type device, or holes for a p-type device) in the channel of the sFinFET can tunnel into and thus be stored in the back gate through the thickness reduced portion of the back gate dielectric layer at certain kinetic energy (represented by a certain bias applied to the transistor). Therefore, this thickness reduced portion of the back gate dielectric layer can serve as a "floating gate dielectric layer," and thus the back gate can serve as a "floating gate." Here, the tunneling may comprise direct tunneling or Fowler-Nordheim tunneling. As a result, the back gate and the back gate dielectric layer constitute a floating-gate configuration for the sFinFET.

Further, the remaining portion of the back gate dielectric layer is thicker than the thickness reduced portion, and thus is less likely to undergo tunneling with respect to the thickness reduced portion. In an example, control may be carried out so that the carries are able to tunnel through the thickness reduced portion while the remaining portion of the back gate dielectric layer undergoes substantially no tunneling. For example, this can be done by applying an appropriate bias to the transistor so that the carries have energy sufficient to tunnel through the thickness reduced portion but insufficient to tunnel through the remaining portion.

According to an embodiment, the thickness reduced portion may be disposed on the same side as the drain region of the sFinFET. In this case, when the sFinFET is turned on, the carries can flow from the source region to the drain region through the fins (with the channel regions formed therein). On the drain side, at least some of the carries may tunnel into and thus be stored in the floating (back) gate through the floating gate dielectric layer (at the thickness reduced portion of the back gate dielectric layer). On the other hand, when the sFinFET is turned on, the carries stored in the floating (back) gate, if present, may be released if a certain bias is applied to the source region. As a result, this memory device can render (at least) two states: one is a state where the floating (back) gate has charges stored therein, and the other is a state where the floating (back) gate has substantially no charges stored therein. For example, the state where the floating (back) gate has charges stored therein may be assumed as logic "1," while the state where the floating (back) gate has substantially no charges stored therein may be assumed as logic "0," or vice versa.

On the other hand, because the back gate is adjacent to the fins of the sFinFET, the charges in the back gate will impact a threshold voltage of the sFinFET. As a result, the sFinFET can have different threshold voltages and thus present different electric characteristics based on presence or absence of the charges stored in the back gate. Therefore, it is possible to read the state (or, "data") of the memory device based on the electric characteristics.

According to some embodiments, the back gate dielectric layer may comprise a first dielectric layer and a second dielectric layer formed sequentially on the side and bottom surfaces of the back gate. The first dielectric layer may have an opening at the region where the thickness reduced portion is. Thus, the thickness reduced portion includes only the second dielectric layer, while the remaining portion includes a stack of both the first dielectric layer and the second dielectric layer.

According to some embodiments, to electrically isolate the gate stack from the substrate, the memory device may comprise an isolation layer formed on the substrate and exposing a portion of each of the fins of the sFin (which portion serves as a "real" fin for the sFinFET when it is completed and thus defines a width of the channel), and the gate stack is disposed on the isolation layer. Because bottom portions of the fins are covered by the isolation layer, the gate stack cannot effectively control the bottom portions of the fins. As a result, there may be current leakage between the source and drain regions via the bottom portions. To suppress the current leakage, the sFinFET may comprise a Punch-Through Stopper (PTS) formed beneath the exposed portions of the fins. For example, the PTS may be disposed substantially in the portions of the fins of the sFin covered by the isolation layer.

According to embodiments, to improve the device performances, the strained source/drain technology may be applied. For example, the source/drain regions may comprise a semiconductor layer having a material different from that of the fins to apply stress to the channel region. For example, for a p-type device, compressive stress may be applied; or for an n-type device, tensile stress may be applied.

According to embodiments of the present disclosure, the memory device may be formed as follows. For example, a back gate groove may be formed in a substrate, and a back gate may be formed by filling a conductive material, such as metal or doped poly silicon, into the back gate groove. Before filling the back gate groove, a back gate dielectric layer may be formed on bottom and side walls of the back gate groove. Further, the back gate dielectric layer may be pattered to have a portion thereof reduced in thickness. For example, the patterning of the back gate dielectric layer may be done by selectively removing a portion of the back gate at one end of the back gate groove to expose a portion of the back gate dielectric layer, reducing the exposed portion of the back gate dielectric layer in thickness, and then refilling a further conductive material into the back gate groove. Next, the substrate may be patterned to form fins abutting the back gate dielectric layer. For example, the substrate may be patterned in such a manner that (fin-like) portions of the substrate are left on the side walls of the back gate groove (specifically, on the back gate dielectric layer formed on the side walls of the back gate groove). Then, a gate stack may be formed on the substrate to intersect the fins.

For convenience of patterning of the back gate groove and the fins, in an example a patterning auxiliary layer may be formed on the substrate. The patterning auxiliary layer may be patterned to have an opening at a position corresponding to the back gate groove, and a pattern transfer layer may be formed on side walls of the patterning auxiliary layer facing the opening. Thus, the patterning of the back gate groove (referred to as "first patterning" hereinafter) may be performed with the patterning auxiliary layer and the pattern transfer layer as a mask. Further, the patterning of the fins (referred to as "second patterning" hereinafter) may be performed with the pattern transfer layer as a mask.

In this way, the fins are formed by two times of patterning: the first patterning in which one side surface of each of the fins is formed, and the second patterning in which the other side surface of each of the fins is formed. During the first patterning, the fins are still connected to and thus are supported by the body of the substrate. Further, during the second patterning, the fins are connected to and thus are supported by the back gate. As a result, it is possible to prevent the fins from collapsing during their manufacture, and thus to manufacture the relatively thin fins at a greater yield.

Before the second patterning, a dielectric layer may be formed in the back gate groove to cover the back gate. The dielectric layer may electrically isolate the back gate (from, e.g., the gate stack) on one hand, and may prevent impacts of the second patterning on the back gate on the other hand.

Further, for convenience of patterning, in an example the pattern transfer layer may be formed on the side walls of the patterning auxiliary layer in a spacer formation process. Because the spacer formation process needs no mask, it is possible to reduce a number of masks used in the manufacture.

According to an embodiment, the substrate may comprise any of Si, Ge, SiGe, GaAs, GaSb, AlAs, InAs, InP, GaN, SiC, InGaAs, InSb, or InGaSb, and the patterning auxiliary layer may comprise amorphous silicon. In this case, to avoid unwanted etching of the patterning auxiliary layer during the patterning of the back gate groove, a protection layer may be formed on a top surface of the patterning auxiliary layer. Further, before formation of the patterning auxiliary layer, a stop layer may be formed on the substrate. Patterning of the patterning auxiliary layer (to form the opening therein) may stop on the stop layer. For example, the protection layer may comprise nitride (e.g., silicon nitride), the pattern transfer layer may comprise nitride, and the stop layer may comprise oxide (e.g., silicon oxide).

Further, according to some embodiments of the present disclosure, an isolation layer may be formed on the substrate with the sFin formed thereon to expose a portion of the sFin (especially, the fins therein). Then, a gate stack may be formed on the isolation layer to intersect the sFin. To form the PTS as described above, ion implantation may be performed after the formation of the isolation layer and before the formation of the gate stack. Due to a formal factor of the sFin and various dielectric layers on top thereof (for example, the pattern transfer layer and the like), the PTS can be disposed substantially in portions of the fins of the sFin covered by the isolation layer. Then, the dielectric layers on top of the sFin (for example, the pattern transfer layer and the like) may be removed. Thus, the later formed gate stack may contact the exposed side and top surfaces of the fins.

The technology disclosed herein may be presented in various ways, some of which will be described in the following by way of example.

Figure 2:
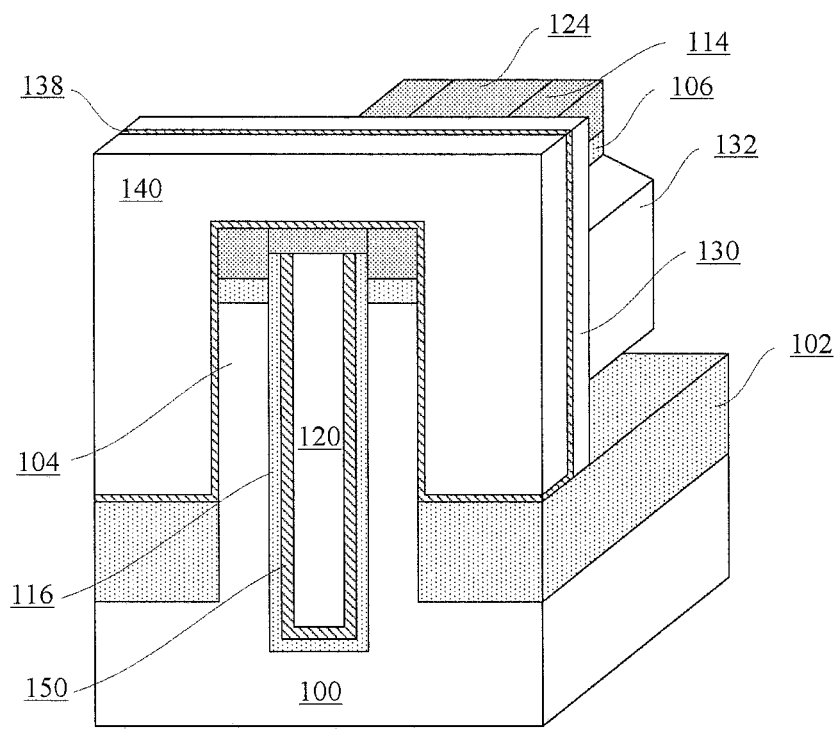
FIG. 2 is a perspective view showing the memory device of FIG. 1 which is cut off along line A1-A1'.
Figure 3:
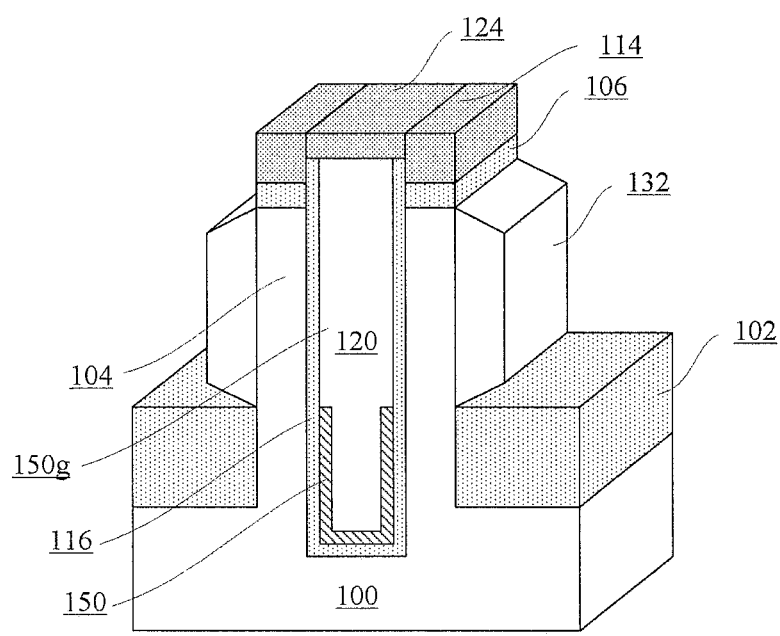
FIG. 3 is a perspective view showing the memory device of FIG. 1 which is cut off along line A2-A2'.
Figure 4:
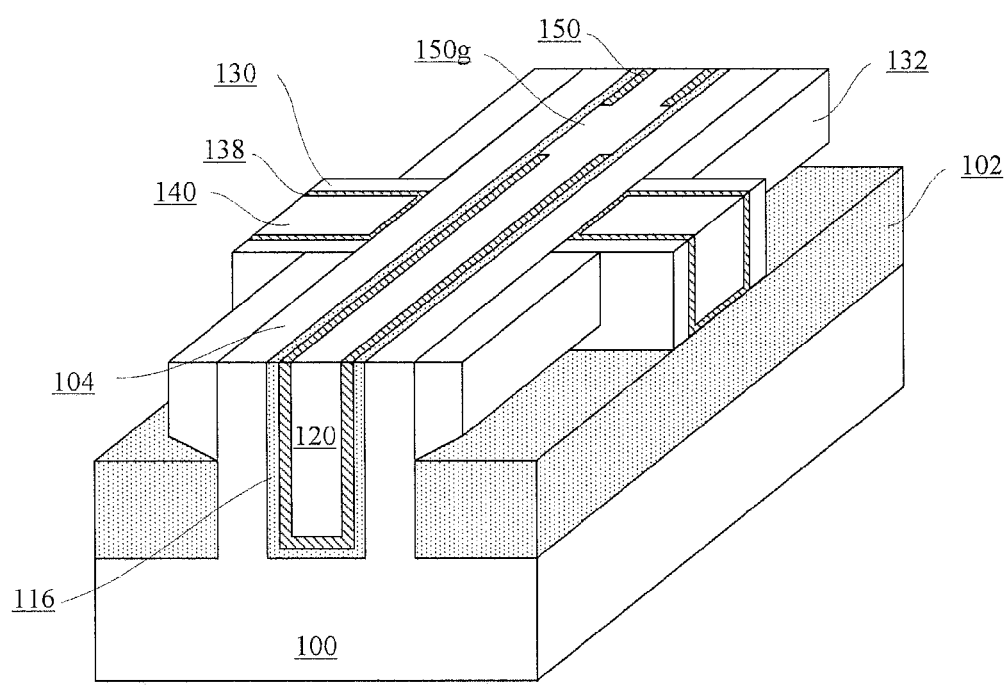
FIG. 4 is a perspective view showing the memory device of FIG. 1 which is cut off along line B-B.

FIG. 1 is a perspective view showing a memory device according to an embodiment of the present disclosure, FIG. 2 is a perspective view showing the memory device of FIG. 1 which is cut off along line A1-A1', FIG. 3 is a perspective view showing the memory device of FIG. 1 which is cut off along line A2-A2', and FIG. 4 is a perspective view showing the memory device of FIG. 1 which is cut off along line B-B'.

As shown in FIG. 1, the memory device comprises a substrate 100, for example, a bulk semiconductor substrate such as Si, Ge, or the like, a compound semiconductor substrate such as SiGe, GaAs, GaSb, AlAs, InAs, InP, GaN, SiC, InGaAs, InSb, InGaSb, or the like, a Semiconductor on Insulator (SOI) substrate, or the like. For convenience, a bulk silicon substrate and silicon system materials are described by way of example in the following.

The memory device further comprises a sFin configuration formed on the substrate. Specifically, the sFin configuration may comprise two fins 104 formed on the substrate and a back gate 120 interposed between the fins. The fins 104 each may have a width of about 3-28 nm for example, and have a first dielectric layer 116 and a second dielectric layer 150 interposed between it and the back gate 120. Further, the first dielectric layer 116 and the second dielectric layer 150 may extend onto a bottom surface of the back gate 120, so that the back gate 120 is separated from the substrate 100. The first gate dielectric layer 116 and the second dielectric layer 150 each may comprise a suitable dielectric material. For example, both of them may comprise high-K dielectrics, or one of them may comprise high-K dielectrics and the other may comprise oxide. In an example, the first dielectric layer 116 may comprise oxide (e.g., silicon oxide) with a thickness of about 1-3 nm, and the second dielectric layer 150 may comprise high-K dielectrics, such as $HfO_2$, with a thickness of about 2-25 nm. A stack of the first gate dielectric layer 116 and the second dielectric layer 150 constitutes a back gate dielectric layer. The back gate 120 may comprise a suitable conductive material, such as doped poly silicon, TiN, W, or any combination thereof, with a width (a dimension in a horizontal direction in the sheet) of about 5-30 nm. The back gate 120 may have its top surface substantially flush with or higher than that of each of the fins 104.

The substrate 100 may have a well region (not shown) formed therein. The back gate 120 may extend into the well region, and thus constitute a coupling capacitor with the well region via the back gate dielectric layer (including the first dielectric layer 116 and the second dielectric layer 150). Therefore, the back gate may have an increased capacity for charge storage, resulting in reduced fluctuations of the charges stored in the back gate and thus improved reliability of the memory device.

In the example shown in FIG. 1, the fins 104 are formed from portions of the substrate 100 and thus integral with the substrate 100. However, the present disclosure is not limited thereto. For example, the fins 104 may be formed from a further epitaxial semiconductor layer grown on the substrate 100.

FIG. 1 also shows a dielectric layer 124 on a top surface of the back gate 120. For example, the dielectric layer 124 may comprise nitride (e.g., silicon nitride). The dielectric layer 124 may electrically isolate the back gate 120 from components (e.g., a back gate) formed on the front side (the upper side in FIG. 1) of the substrate 100.

Further, FIG. 1 also shows dielectric layers 106 (e.g., oxide) and 114 (e.g., nitride) on top of the fins 104. Those dielectric layers may be those survived from the manufacture of the memory device, and can be left on top of the fins 104 or removed as desired.

As shown in FIGS. 1 and 2, the memory device may further comprise a gate stack formed on the substrate 100. The gate stack may comprise a gate dielectric layer 138 and a gate conductor layer 140. For example, the gate dielectric layer 138 may comprise a high-K dielectric material such as $HfO_2$, with a thickness of about 1-5 nm, and the gate conductor layer 140 may comprise a metal gate conductor. Further, the gate dielectric layer 138 may further comprise a thin oxide layer (on which the high-K gate dielectric layer is disposed), with a thickness of about 0.3-1.2 nm. A work function adjustment layer (not shown) may be disposed between the gate dielectric layer 138 and the gate conductor 140. Further, gate spacers 130 may be formed on opposite sides of the gate stack. For example, the gate spacers 130 each may comprise nitride, with a thickness of about 5-20 nm. The back gate 120 is isolated from the gate stack by the dielectric layer 124 on the top surface thereof.

In the example shown in FIG. 1, the memory device may further comprise an isolation layer 102 formed on the substrate. The gate stack is isolated from the substrate 100 by the isolation layer 102. For example, the isolation layer 102 may comprise oxide (e.g., silicon oxide). It is to be noted that the isolation layer 102 needs not to be formed separately in some cases, for example, in a case where the substrate 100 is an SOI substrate. In this case, the fins 104 may be formed from an SOI layer of the SOI substrate, and a buried insulation layer of the SOI substrate may serve as such an isolation layer.

Due to the gate stack, a channel region (corresponding to a portion of each of the fins intersecting the gate stack) and source/drain regions (corresponding to portions of each of the fins on opposites sides of the channel region) are defined in the sFin. In the memory device shown in FIG. 1, the source/drain regions may further comprise a semiconductor layer 132 grown on surfaces of the fins. The semiconductor layer 132 may comprise a material different from that of the fins 104, to apply stress to the fins 104 (especially, the channel regions therein). For example, in a case where the fins 104 comprise Si, the semiconductor layer 132 may comprise Si:C (where an atomic percentage of C is about 0.2-2%, for example) for an n-type device to apply tensile stress, or SiGe (where an atomic percentage of Ge is about 15-75%, for example) for a p-type device to apply compressive stress. Further, the semiconductor layer 132 expands the source/drain regions, facilitating formation of contacts to the source/drain regions.

As shown in FIG. 2, the gate stack intersects a side surface (opposite to the back gate 120) of each of the fins 104. Specifically, the gate dielectric layer 138 may be in contact with the side surface of each of the fins 104, and thus the gate conductor layer 140 may control generation of conductive channels in the side surface of each of the fins 104 via the gate dielectric layer 138. As a result, this memory device may constitute a dual-gate device. Alternatively, in a case where the dielectric layers 106 and 114 on top of the fins 104 are removed, top surfaces of the fins 104 may also have conductive channels formed therein. In this case, the memory device may constitute a four-gate device.

As shown in FIGS. 3 and 4, the second dielectric layer 150 has openings 150g at regions facing the fins 104 on one side of the gate stack. In this example, the openings 150g may be disposed on the same side as the drain region (the side opposite to the source region). As shown in FIGS. 3 and 4, in some portions of the drain region, the second dielectric layer 150 is present on the bottom wall and lower portions of the side walls of the back gate 120, and the openings 150g each may have a rectangular shape. Further, in this example, the openings 150g do not extend across the entire drain region, but occupy only some portions of the drain region. It is to be noted that the openings 150g each may be disposed at any suitable position in any suitable shape, provided that such openings can be manufactured.

As a result, at the openings 150g, the back gate 120 faces each of the fins 104 via a portion of the back gate dielectric layer with a reduced thickness (including only the first dielectric layer 116), and thus constitutes, together with the thickness reduced portion of the back gate dielectric layer (specifically, the first dielectric layer 116), a floating-gate configuration for a FinFET comprising the gate stack (or, a control gate) and the fins 104.

Though the back gate dielectric layer is shown as the stack of the first and second dielectric layers, the present disclosure is not limited thereto. The back gate dielectric layer may be in any suitable configuration, for example, a single layer or a stack of three or more layers, provided that there is such a thickness reduced portion on one side of the gate stack. Further, the thickness reduced portion may be disposed at any suitable position, in any suitable shape and of any suitable size.

FIGS. 5-27 are schematic views showing a flow of manufacturing a memory device according to an embodiment of the present disclosure.

Figure 5:
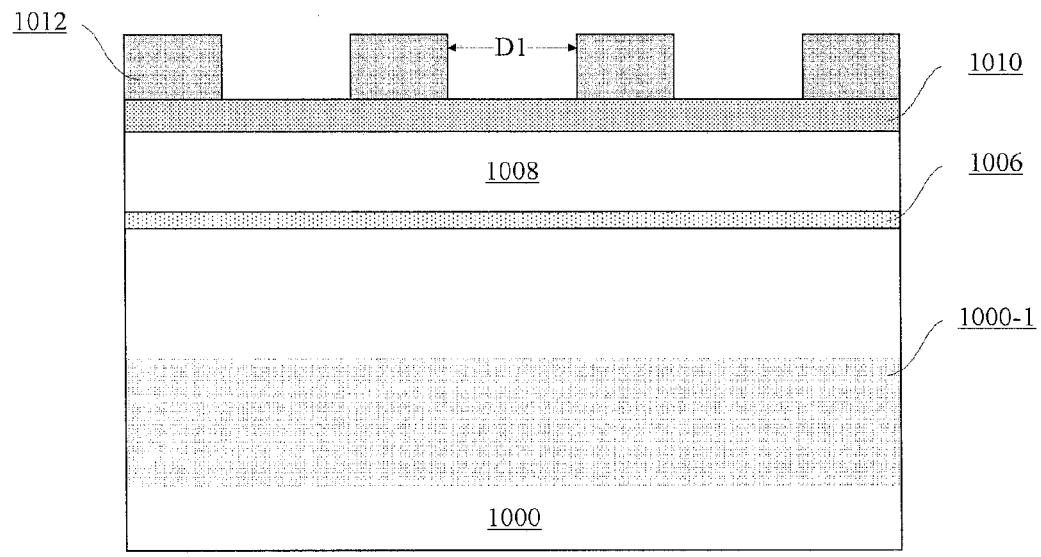
FIG. 5 is a schematic view of one stage of the manufacture of a memory device according to an embodiment of the present disclosure.

As shown in FIG. 5, a substrate 1000, such as a bulk silicon substrate, is provided. In the substrate 1000, a well region 1000-1 may be formed by, for example, ion implantation. For example, the well region may be formed to have an n-type conductivity for a p-type device, or a p-type conductivity for an n-type device. The n-type well region may be formed by implanting n-type impurities such as P or As into the substrate 1000, and the p-type well region may be formed by implanting p-type impurities such as B into the substrate 1000. Annealing may be performed after the implantation if needed. There are various ways to form the n-type well or p-type well, and detailed descriptions thereof are omitted here.

On the substrate 1000, a stop layer 1006, a patterning auxiliary layer 1008 and a protection layer 1010 may be sequentially formed. The stop layer 1006 may comprise oxide (e.g., silicon oxide) with a thickness of about 5-25 nm, the patterning auxiliary layer 1008 may comprise amorphous silicon with a thickness of about 50-200 nm, and the protection layer 1010 may comprise nitride (e.g., silicon nitride) with a thickness of about 5-15 nm. The materials for those layers are selected to provide etching selectivity in later processes. It is to be understood by those skilled in the art that those layers may comprise other suitable materials, and that some of them may be even omitted in some cases.

Next, a photoresist layer 1012 may be formed on the protection layer 1010. The photoresist layer 1012 may be patterned by, e.g., photolithography, to form openings therein at positions corresponding to back gates to be formed. The openings each may have a width D1 of about 15-100 nm.

Figure 6:
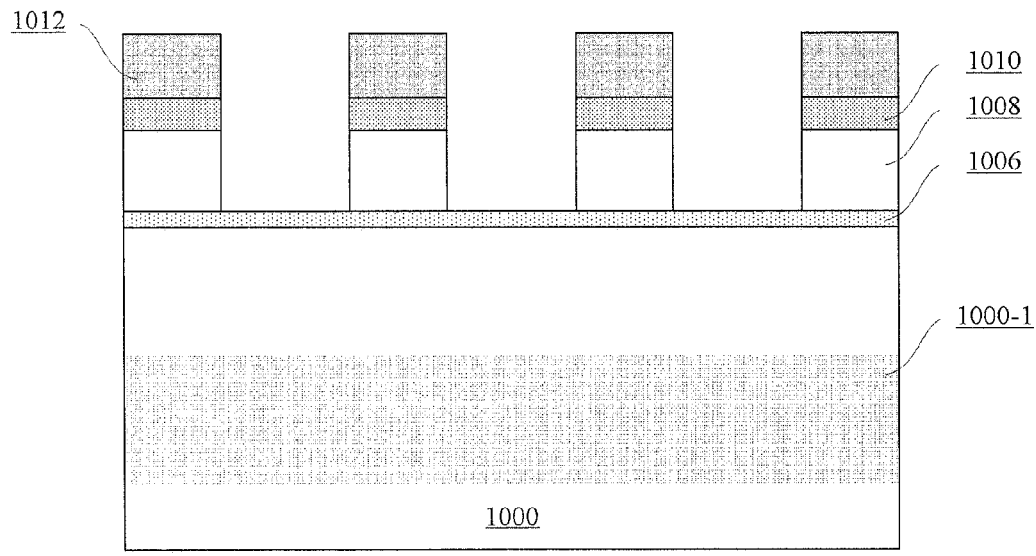
FIG. 6 is a schematic view of another stage of the manufacture of a memory device according to an embodiment of the present disclosure.

Then, as shown in FIG. 6, the protection layer 1010 and the patterning auxiliary layer 1008 may be sequentially etched by, e.g., Reactive Ion Etching (RIE), with the photoresist layer 1012 as a mask, to form openings in the protection layer 1010 and the patterning auxiliary layer 1008. The etching may stop on the stop layer 1006. If the patterning auxiliary layer 1008 and the underlying substrate 1000 have sufficient etching selectivity with respect to each other, the stop layer 1006 may be even omitted. Then, the photoresist layer 1012 may be removed.

Figure 7:
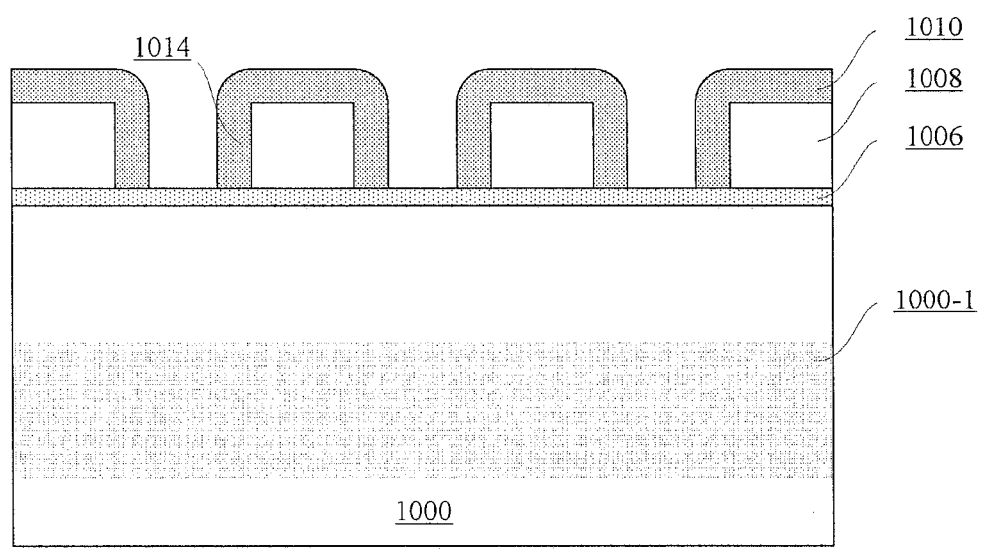
FIG. 7 is a schematic view of another stage of the manufacture of a memory device according to an embodiment of the present disclosure.

Then, as shown in FIG. 7, a pattern transfer layer 1014 may be formed on side walls of the patterning auxiliary layer 1008 (facing the openings). The pattern transfer layer 1014 may be formed in a spacer formation process. For example, a nitride layer may be deposited on a surface of the arrangement shown in FIG. 6 (with the photoresist layer 1012 removed), and then etched by RIE to form the pattern transfer layer as spacers. The deposited nitride layer may have a thickness of about 3-28 nm (which substantially determines a width of a fin to be formed). The deposition may comprise Atom Layer Deposition (ALD). There are various ways to form such spacers, and detailed descriptions thereof are omitted here.

Figure 8:
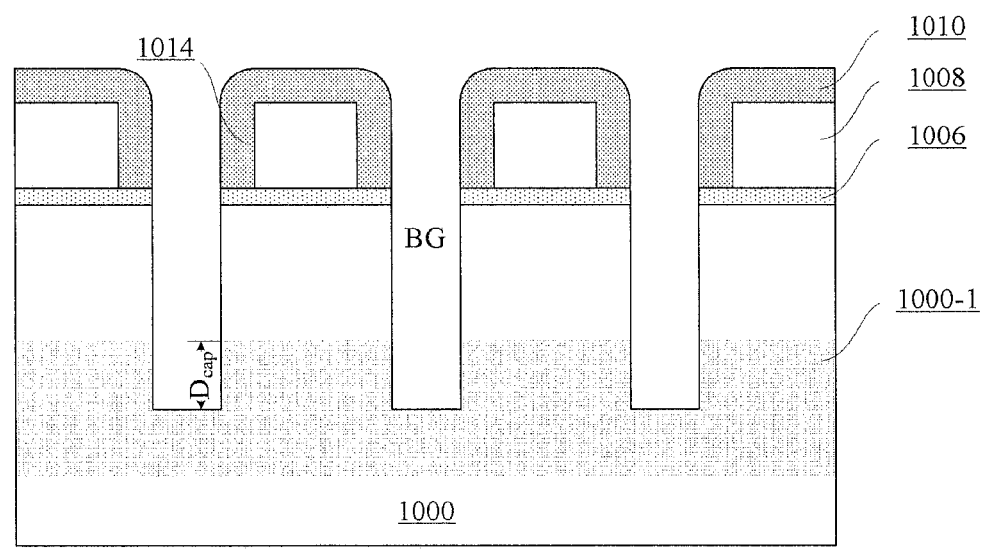
FIG. 8 is a schematic view of another stage of the manufacture of a memory device according to an embodiment of the present disclosure.

Next, as shown in FIG. 8, the substrate 1000 may be patterned with the patterning auxiliary layer 1008 and the pattern transfer layer 1014 as a mask, to form back gate grooves BG therein. Here, the stop layer 1006 and the substrate 1000 may be sequentially etched by RIE, to form the back gate grooves BG. Due to the presence of the protection layer 1010, the RIE has substantially no impact on the patterning auxiliary layer 1008. If the patterning auxiliary layer 1008 has sufficient etching selectivity with respect to the stop layer 1006 and the substrate 1000, the protection layer 1010 may be even omitted.

According to an embodiment, the back gate grooves BG may extend into the well region 1000-1. For example, a bottom surface of the back gate groove BG is recessed with respect to a top surface of the well region 1000-1 by a depth of $D_{cap}$, as shown in FIG. 8. $D_{cap}$ may fall between about 10-30 nm.

Figure 9A:
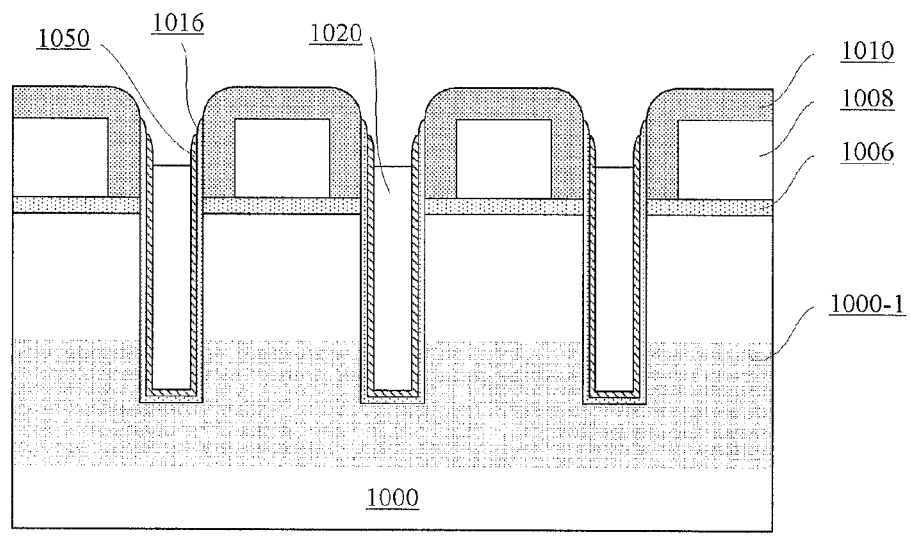
FIG. 9(a) is a schematic sectional view of another stage of the manufacture of a memory device according to an embodiment of the present disclosure.
Figure 9B:
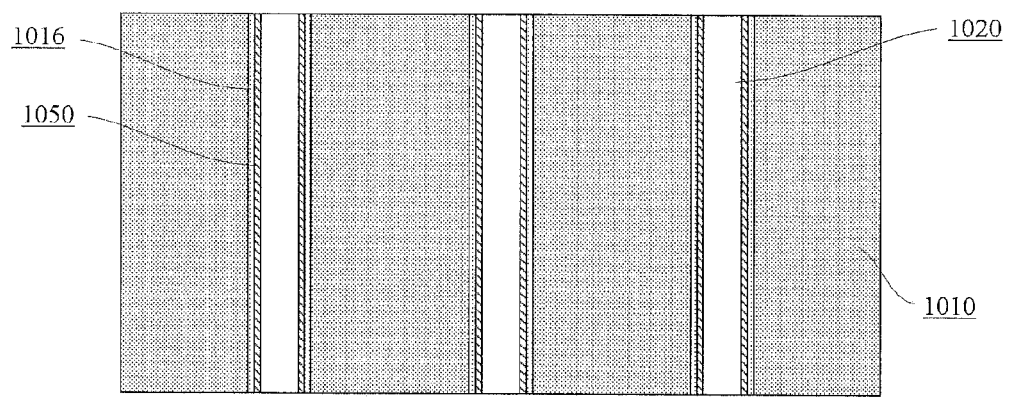
FIG. 9(b) is a top schematic view of another stage of the manufacture of a memory device according to an embodiment of the present disclosure.

Subsequently, as shown in FIG. 9(a) (a sectional view) and FIG. 9(b) (a top view), a first dielectric layer 1016 and a second dielectric layer 1050 may be sequentially formed on bottom and side walls of the back gate grooves BG. The first dielectric layer 1016 may comprise any suitable dielectric material, such as oxide (e.g., silicon oxide), with a thickness of about 1-3 nm. The second dielectric layer 1050 may comprise any suitable dielectric material, for example, a high-K dielectric material such as $HfO_2$, with a thickness of about 2-25 nm. Then, a conductive material (e.g., doped poly silicon at a concentration of about 1E18-1E21 $cm^{-3}$) may be filled into the back gate grooves BG, to form back gates 1020. For example, the first dielectric layer 1016, the second dielectric layer 1050, and the back gates 1020 may be formed as follows. Specifically, a thin layer of a first dielectric material, a thin layer of a second dielectric material, and a relatively thick layer of a conductive material may be deposited in sequence. The deposition is conducted so that the conductive material completely fills the back gate grooves BG. Then, the deposited conductive material may be etched back. The back gates 1020 etched back each may have a top surface substantially flush with or higher than that of the substrate 1000 (in this example, the top surface of the substrate 1000 corresponds to a top surface of fins to be formed later). After that, RIE may be performed on the second dielectric layer and the first dielectric layer sequentially. Here, the RIE of the dielectric layers may be performed in a spacer process.

Figure 10:
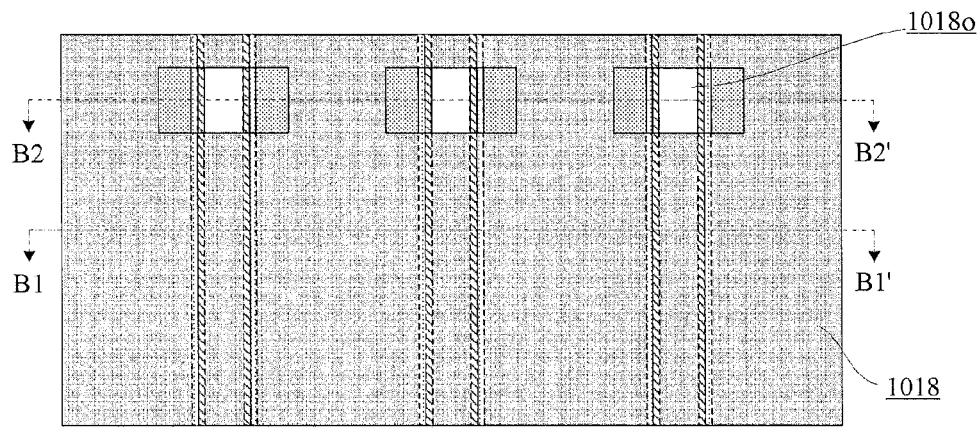
FIG. 10 is a schematic view of another stage of the manufacture of a memory device according to an embodiment of the present disclosure.
Figure 11:
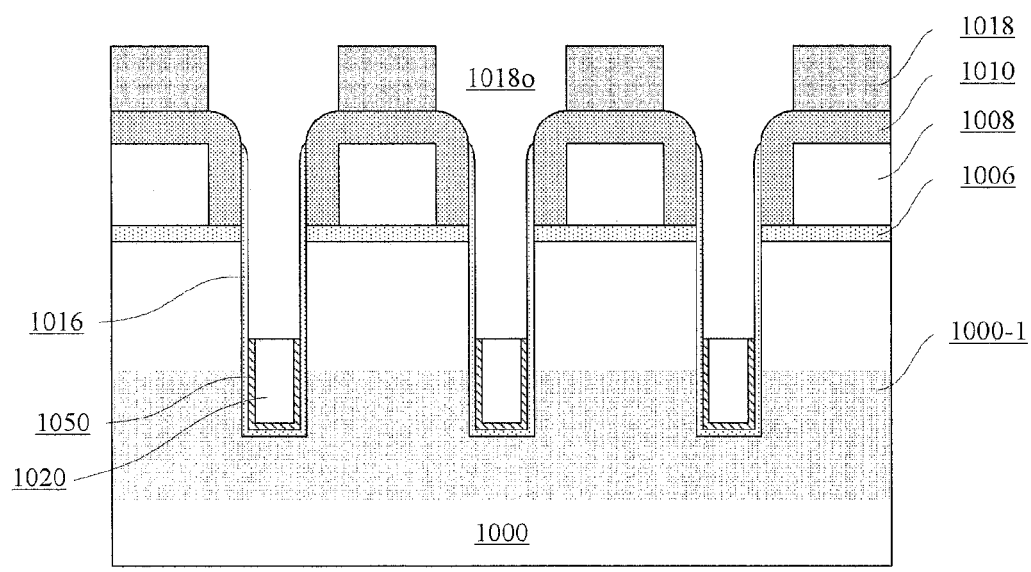
FIG. 11 is a schematic sectional view about lines B2-B2' of FIG. 10 showing another stage of the manufacture of a memory device according to an embodiment of the present disclosure.

Next, the second dielectric layer 1050 may be patterned to form openings therein. For example, this can be done as follows. Specifically, as shown in FIG. 10, a photoresist layer 1018 may be formed on the arrangement of FIG. 9, and then patterned to include openings 1018o (on one side of a gate stack to be formed). Each of the openings 1018o exposes at least a portion of the back gate 1020 and a portion of the second dielectric layer 1050 of each of the sFins. Then, as shown in FIG. 11 (a sectional view taken in line B2B2' in FIG. 10), the back gates 1020 may be etched back via the openings 1080o to be recessed, and exposed portions of the second dielectric layer 1050 may be removed by selective etching. After the patterning as described above, the photoresist layer 1018 may be removed.

Figure 12:
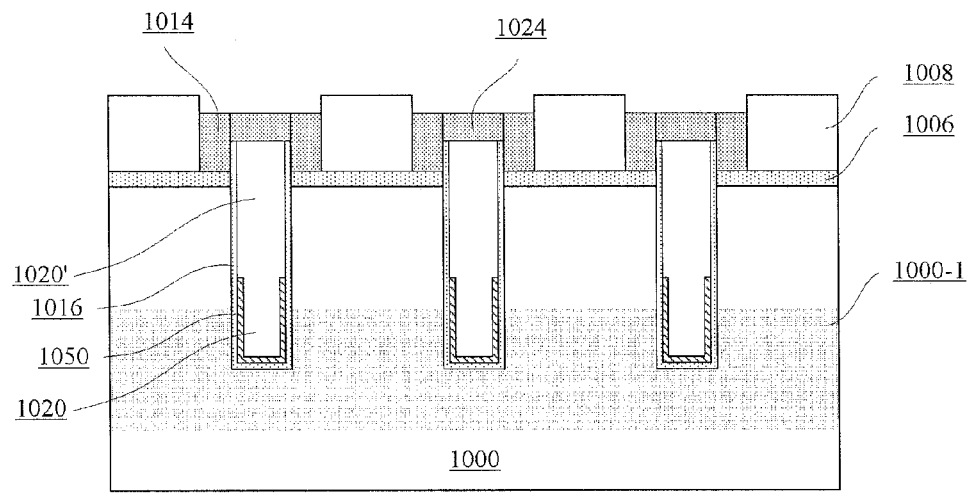
FIG. 12 is a schematic view of another stage of the manufacture of a memory device according to an embodiment of the present disclosure.

Then, as shown in FIG. 12, a conductive material 1020' may be refilled into the back gate grooves. The refilled conductive material 1020' may have a level substantially the same as that of the back gate 1020 as originally formed, and may comprise a material the same as or different from that of the back gate 1020. In the following, assume that the conductive material 1020' and the conductive material of the back gate 1020 are the same, for example, doped poly silicon, and are shown together as "1020," without distinguishing them, for convenience.

Figure 13:
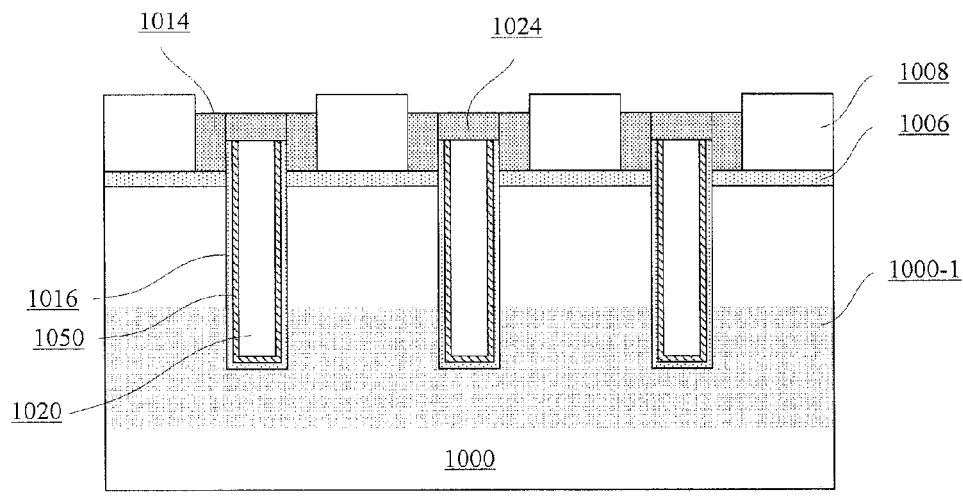
FIG. 13 is a schematic sectional view about lines B1-B1' of FIG. 10 showing another stage of the manufacture of a memory device according to an embodiment of the present disclosure.

To avoid interference between the back gates 1020 and the gate stack to be formed later, a dielectric layer 1024 may be further filled into the back gate grooves BG to cover the back gates 1020, as shown in FIGS. 12 and 13. For example, the dielectric layer 1024 may comprise nitride, and may be formed by depositing and then etching back a nitride layer. During the etching back, the protection layer 1010 on top of the patterning auxiliary layer 1008 may be also removed, to expose the patterning auxiliary layer 1008.

Due to the above processes, a section taken along line B1B1' in FIG. 10 will present a profile as shown in FIG. 13. In an example, before filling the dielectric layer 1024, portions of the first and second dielectric layers above the top surface of the back gates 1020 may be removed by, e.g., selective etching.

As shown in FIGS. 12 and 13, the first dielectric layer 1016 and the second dielectric layer 1050 are present on the bottom and side walls of each of the back gates 1020, and thus constitute a back gate dielectric layer for the back gate 1020. The second dielectric layer 1050 is patterned to have openings, so that the back gate dielectric layer has a reduced thickness at the openings. It is to be appreciated by those skilled in the art that the openings in the second dielectric layer 1050 may be disposed at any suitable position, in any suitable shape and of any suitable size.

After the back gates are formed as described above, the substrate 1000 may be patterned to form the fins.

Figure 14:
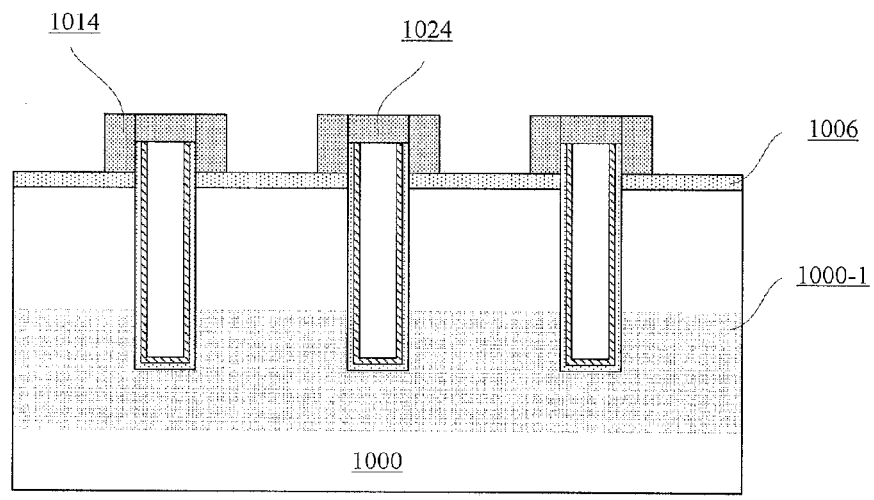
FIG. 14 is a schematic view of another stage of the manufacture of a memory device according to an embodiment of the present disclosure.
Figure 15:
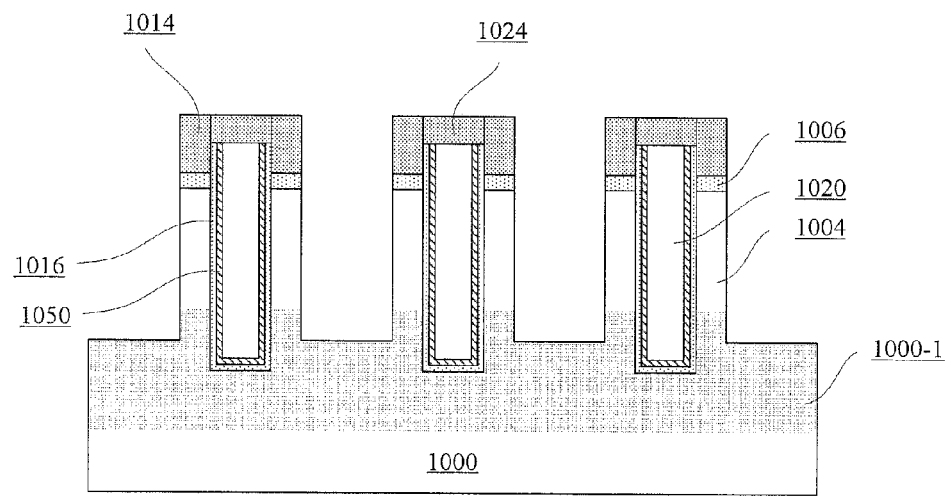
FIG. 15 is a schematic view of another stage of the manufacture of a memory device according to an embodiment of the present disclosure.

Specifically, as shown in FIG. 14, the patterning auxiliary layer 1008 may be removed by selective etching, for example, wet etching with TMAH solution, to leave the pattern transfer layer 1014. Then, the stop layer 1006 and the substrate 1000 may be selectively etched by, e.g., RIE, with the pattern transfer layer 1014 as a mask, as shown in FIG. 15. As a result, fin-like portions 1004 of the substrate are left on opposite sides of the respective back gates 1020. Those fin-like portions correspond to the pattern transfer layer 1014 in shape.

In the example shown in FIG. 15, the fins 1004 each are shown as including a portion of the well region 1000-1. However, the present disclosure is not limited thereto. For example, the fins may include no portions from the well region 1000-1, especially when a PTS is formed as described in the following. Further, according to embodiments of the present disclosure, in order that the back gates 1020 (specifically, charges stored therein) can effectively control the respective fins 1004, the fins 1004 may have a vertical extent not beyond that of the respective back gates 1020.

In this way, an sFin configuration according to this embodiment is achieved. As shown in FIG. 15, the sFin configuration comprises the back gate 1020 and the fins 1004 on opposite sides of the back gate 1020. Further, in the sFin, the top surfaces of the fins 1004 are covered by dielectric layers (including the stop layer 1006 and the pattern transfer layer 1014). Thus, the gate stack to be formed later will intersect a side surface (opposite to the back gate 1020) of each of the fins, and thus control generation of the conductive channel in this side surface, resulting in a double-gate device.

After the sFins are achieved by the above processes, sFinFETs can be made based on the sFins. In the example shown in FIG. 15, there are three sFins. However, the present disclosure is not limited thereto. For example, more or less sFins may be formed as desired, and the sFins may be formed in a different layout than that shown in the figures where the sFins are disposed in parallel.

In the following, an exemplary flow of making sFinFETs will be described.

Figure 16:
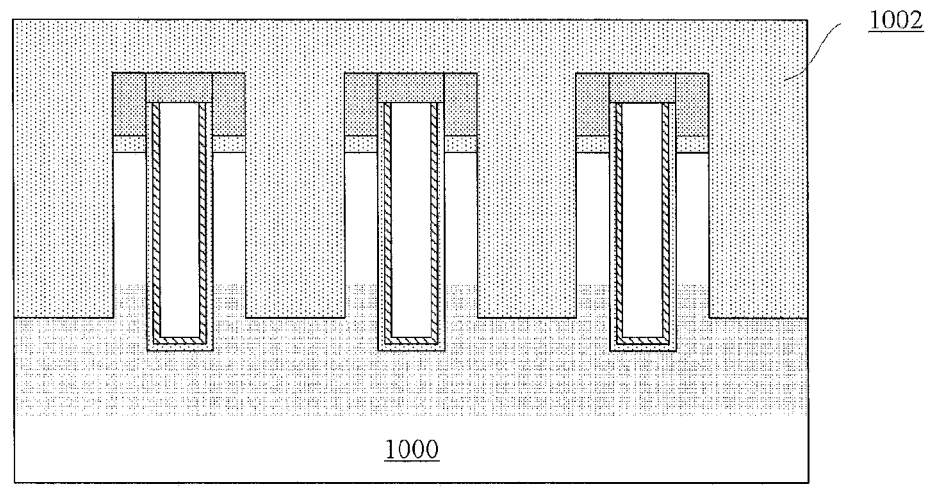
FIG. 16 is a schematic view of another stage of the manufacture of a memory device according to an embodiment of the present disclosure.

To make the sFinFETs, an isolation layer may be formed on the substrate 1000. For example, as shown in FIG. 16, a dielectric layer 1002 (e.g., oxide) may be formed by, e.g., deposition, on the substrate, and then etched back to form the isolation layer. Generally, the deposited dielectric layer can cover the sFins entirely, and may be planarized by, e.g., Chemical Mechanical Polishing (CMP), before being etched back. Preferably, the planarization of the deposited dielectric layer may be carried out by sputtering. For example, the sputtering can be done with plasma, such as plasma of Ar, N, or the like.

Figure 17:
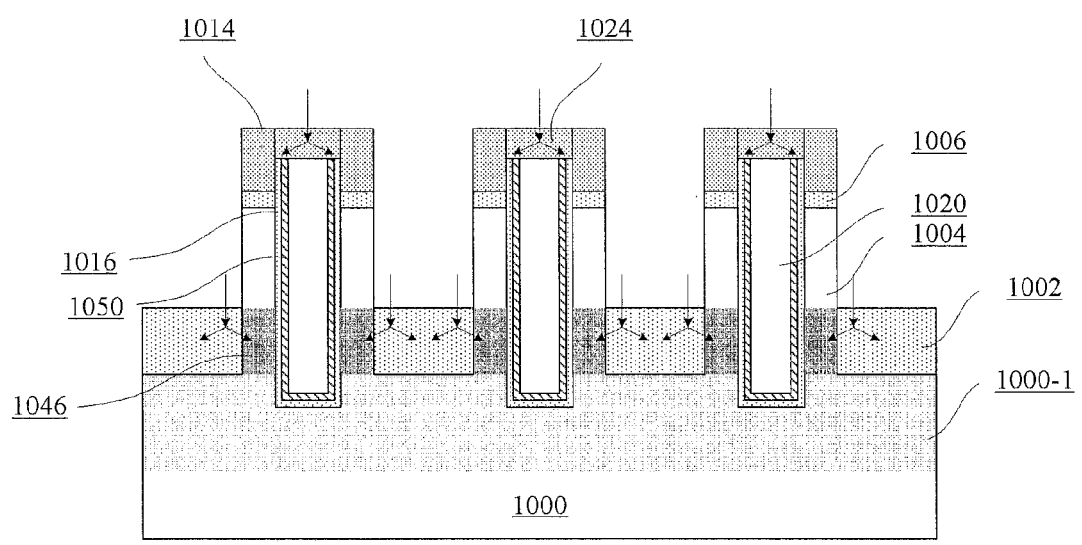
FIG. 17 is a schematic view of another stage of the manufacture of a memory device according to an embodiment of the present disclosure.

To improve the device performances, especially, to reduce source/drain leakage, a Punch-Through Stopper (PTS) 1046 may be formed by ion implantation, as shown by arrows in FIG. 17. For example, p-type impurities, such as B, $BF_2$ or In, may be implanted for an n-type device, and n-type impurities, such as As or P, may be implanted for a p-type device. The ion implantation may be carried out substantially perpendicular to the surface of the substrate. Parameters adopted in the ion implantation may be controlled so that the PTS is formed in portions of the fins 1004 underneath a surface of the isolation layer 1002 and has a desired doping concentration of, e.g., 5E17-2E19 $cm^{-3}$, greater than that of the well region 1000-1 in the substrate. It is to be noted that the formal factor of the sFins (being elongate) and the dielectric layers on top thereof facilitate forming a steep doping profile in the depth direction Annealing, such as spike annealing, laser annealing, and/or rapid annealing, may be performed to activate the implanted dopants. The PTS helps reduce the source/drain leakage.

Figure 18:
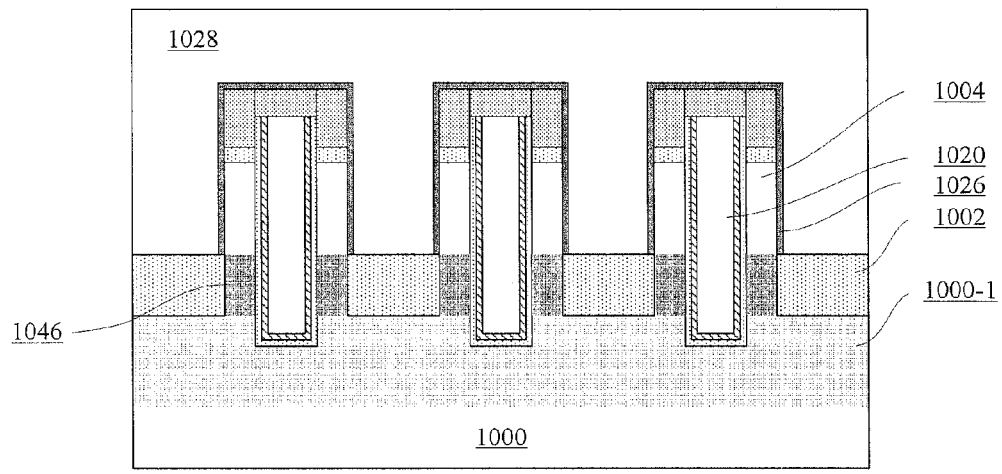
FIG. 18 is a schematic view of another stage of the manufacture of a memory device according to an embodiment of the present disclosure.

Next, a gate stack may be formed on the isolation layer 1002 to intersect the sFins. For example, this can be done as follows. Specifically, as shown in FIG. 18, a gate dielectric layer 1026 may be formed by, e.g., deposition. For example, the gate dielectric layer 1026 may comprise oxide, with a thickness of about 0.8-1.5 nm. In the example shown in FIG. 18, the gate dielectric layer 1026 is shown to be on side and top surfaces of the sFins. However, the gate dielectric layer 1026 may extend onto the top surface of the isolation layer 1002. Then, a gate conductor layer 1028 may be formed by, e.g., deposition. For example, the gate conductor layer 1028 may comprise poly silicon. The gate conductor layer 1028 may fill gaps between the sFins, and be planarized by, e.g., CMP.

Figure 19:
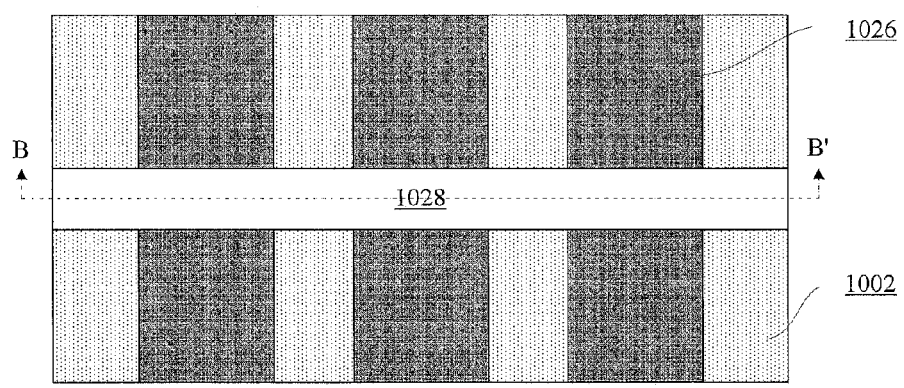
FIG. 19 is a schematic view of another stage of the manufacture of a memory device according to an embodiment of the present disclosure.

As shown in FIG. 19, the gate conductor layer 1028 may be patterned. In the example shown in FIG. 19, the gate conductor layer 1028 may be patterned to a bar crossing the sFins. According to a further embodiment, the gate dielectric layer 1026 may be further patterned with the patterned gate conductor layer 1028 as a mask.

After formation of the patterned gate conductor, halo implantation and extension implantation may be carried out with the gate conductor as a mask.

Figure 20A:
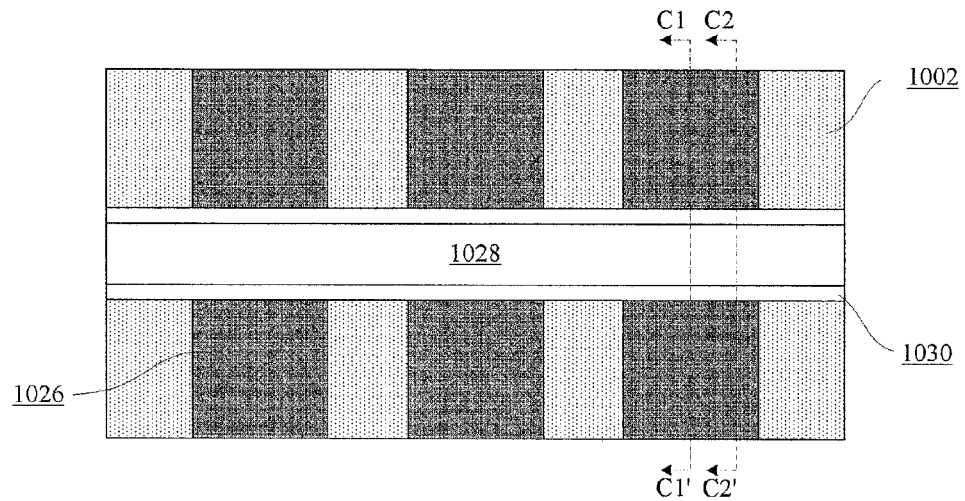
FIG. 20(a) is a schematic view of another stage of the manufacture of a memory device according to an embodiment of the present disclosure.
Figures 20B, 20C:
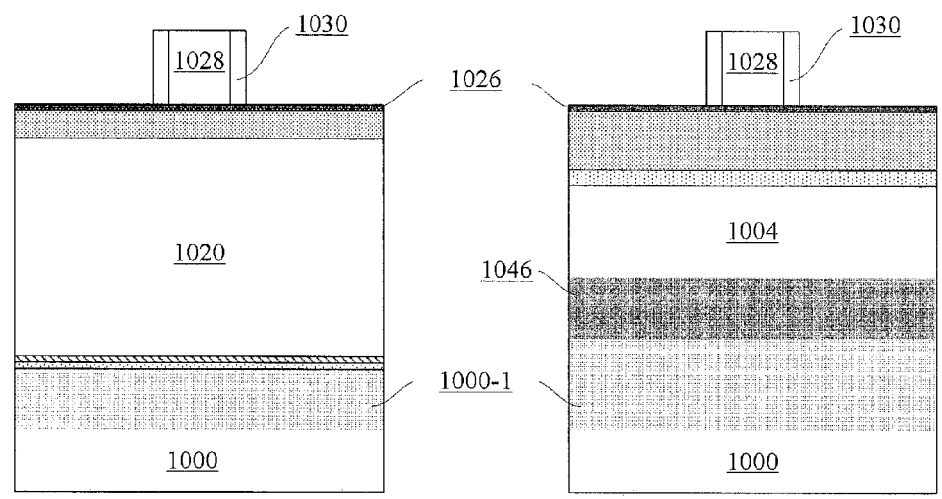
FIG. 20(b) is a schematic sectional view about lines C1-C1' of FIG. 20(a) showing another stage of the manufacture of a memory device according to an embodiment of the present disclosure.
FIG. 20(c) is a schematic sectional view about lines C2-C2' of FIG. 20(a) showing another stage of the manufacture of a memory device according to an embodiment of the present disclosure.

Next, as shown in FIGS. 20(*a*)-20(*c*) (where FIG. 20(*b*) is a sectional view taken along C1C1' in FIG. 20(*a*), and FIG. 20(*c*) is a sectional view taken along C2C2' in FIG. 20(*a*)), gate spacers 1030 may be formed on side walls of the gate conductor layer 1028. For example, a nitride layer (e.g., silicon nitride) with a thickness of about 5-20 nm may be deposited and then etched by RIE, to form the spacers 1030. Here, the amount of RIE may be controlled in forming the gate spacers, so that the gate spacers 1030 have substantially no portions on the side walls of the sFins. There are various ways to form the spacers, and detailed descriptions thereof are omitted here.

After formation of the spacers, source/drain (S/D) implantation may be carried out with the gate conductor and the spacers as a mask. Then, annealing may be performed to activate implanted ions to form S/D regions, resulting in sFinFETs.

Figure 21A:
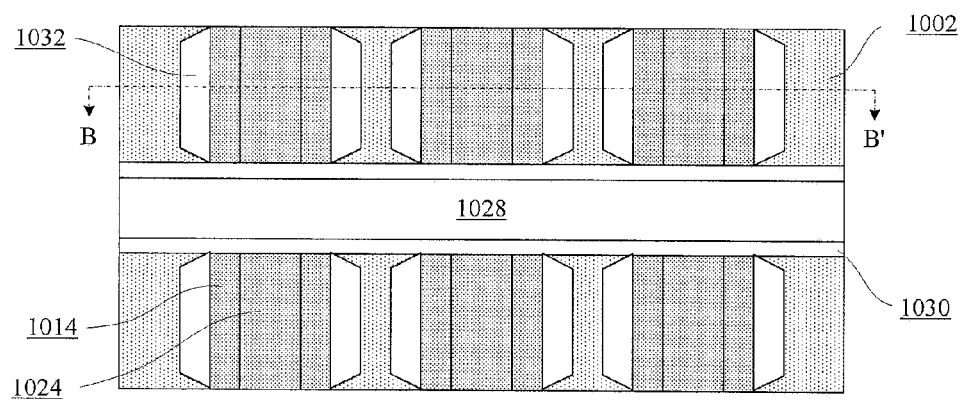
FIG. 21(a) is a schematic view of another stage of the manufacture of a memory device according to an embodiment of the present disclosure.
Figure 21B:
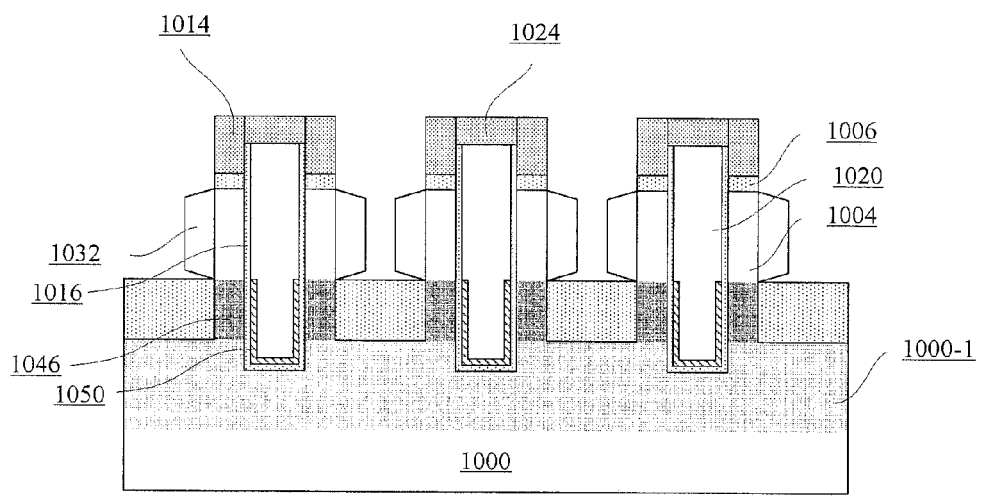
FIG. 21(b) is a schematic sectional view about lines B-B' of FIG. 21(a) showing another stage of the manufacture of a memory device according to an embodiment of the present disclosure.

To improve the device performances, in an example the strained S/D technology may be utilized. Specifically, as shown in FIGS. 21(*a*)-21(*b*) (where FIG. 21(*b*) is a sectional view taken along BB' in FIG. 21(*a*)), exposed portions of the gate dielectric layer 1026 may be selectively removed. Then, on exposed surfaces of the fins 1004 by the gate stack (corresponding to the S/D regions), a semiconductor layer 1032 may be formed by epitaxy. In an example, the semiconductor layer 1032 may be doped in-situ during the epitaxy. For example, the semiconductor layer 1032 may be n-type doped in-situ for an n-type device, or p-type doped in situ for a p-type device. To further improve the device performances, the semiconductor layer 1032 may comprise a different material from that of the fins 1004, to apply stress to the fins 1004 (where the channel regions are to be formed). For example, in a case where the fins 1004 comprise Si, the semiconductor layer 1032 may comprise Si:C (where an atomic percentage of C may be about 0.2-2%, for example) for an n-type device to apply tensile stress, or SiGe (where an atomic percentage of Ge may be about 15-75%, for example) for a p-type device to apply compressive stress. On the other hand, the grown semiconductor layer 1032 extends the source/drain regions laterally to an extent, facilitating formation of contacts to the S/D regions.

As shown in FIG. 21(*b*), due to the openings of the second dielectric layer 1050 on one side of the gate stack (for example, the drain side), the back gate 1020 can face the fins 1040 on this side of the gate stack via the thickness reduced portion of the back gate dielectric layer (i.e., the first dielectric layer 1016), resulting in a memory device in a floating-gate configuration.

In the above embodiment, the gate stack is directly formed after formation of the sFins. However, the present disclosure is not limited thereto. For example, a gate last process also applies.

According to another embodiment of the present disclosure, the gate dielectric layer 1026 and the gate conductor layer 1028 shown in FIG. 18 are a sacrificial gate dielectric layer and a sacrificial gate conductor layer, respectively. (In this case, operations described with reference to FIGS. 18 and 19 result in a sacrificial gate stack.) Next, the gate spacers 1030 may be formed in the same way as described above with reference to FIGS. 20(*a*)-20(*c*). Likewise, the strained S/D technology may be also applied as described with reference to FIGS. 21(*a*) and 21(*b*).

Then, the sacrificial gate stack may be handled according to the gate last process to form a real gate stack. For example, this can be done as follows.

Figure 22A:
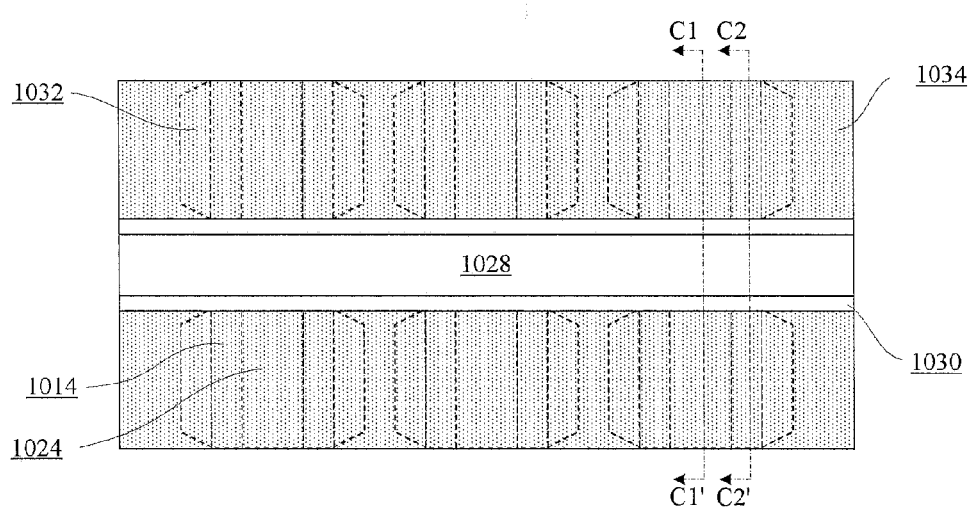
FIG. 22(a) is a schematic view of another stage of the manufacture of a memory device according to an embodiment of the present disclosure.
Figures 22B, 22C:
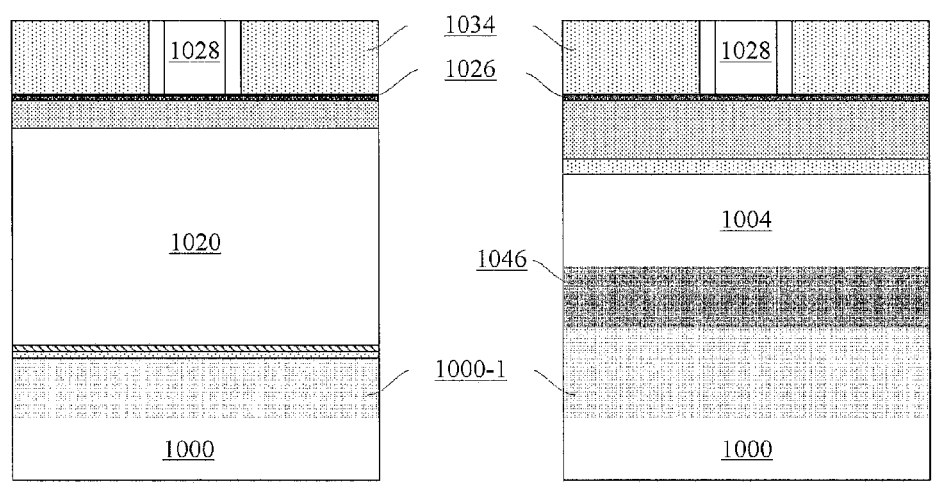
FIG. 22(b) is a schematic sectional view about lines C1-C1' of FIG. 22(a) showing another stage of the manufacture of a memory device according to an embodiment of the present disclosure.
FIG. 22(c) is a schematic sectional view about lines C2-C2' of FIG. 22(a) showing another stage of the manufacture of a memory device according to an embodiment of the present disclosure.

Specifically, as shown in FIGS. 22(*a*)-22(*c*) (where FIG. 22(*b*) is a sectional view taken along C1lC1' in FIG. 22(*a*), and FIG. 22(*c*) is a sectional view taken along C2C2' in FIG. 22(*a*)), a dielectric layer 1034 may be formed by, e.g., deposition. The dielectric layer 1034 may comprise oxide. Then, the dielectric layer 1034 may be planarized by, e.g., CMP. The CMP may stop at the gate spacers 1030, and thus the sacrificial gate conductor layer 1028 is exposed.

Next, as shown in FIGS. 23(*a*)-23(*b*) (where FIG. 23(*a*) is a sectional view corresponding to that of FIG. 22(*b*), and FIG. 23(*b*) is a sectional view corresponding to that of FIG. 22(*c*)), the sacrificial gate conductor layer 1028 may be selectively removed by means of, e.g., TMAH solution, leaving a gate groove 1036 between the gate spacers 1030. According to a further embodiment, the sacrificial gate dielectric layer 1026 may be further removed.

Figure 23A:
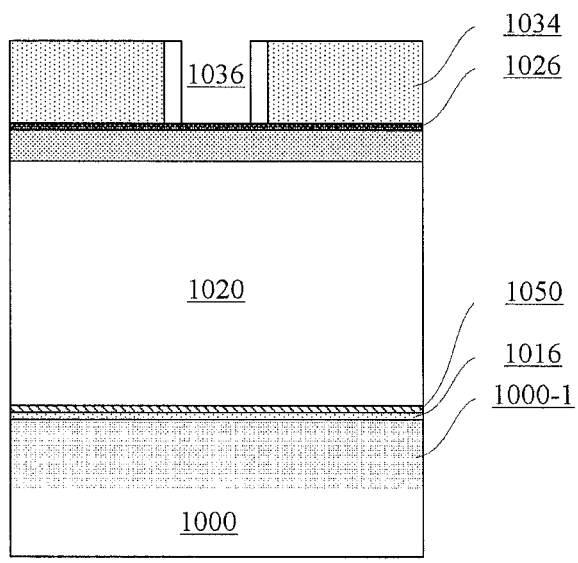
FIG. 23(a) is a schematic sectional view corresponding to FIG. 22(b)
Figure 23B:
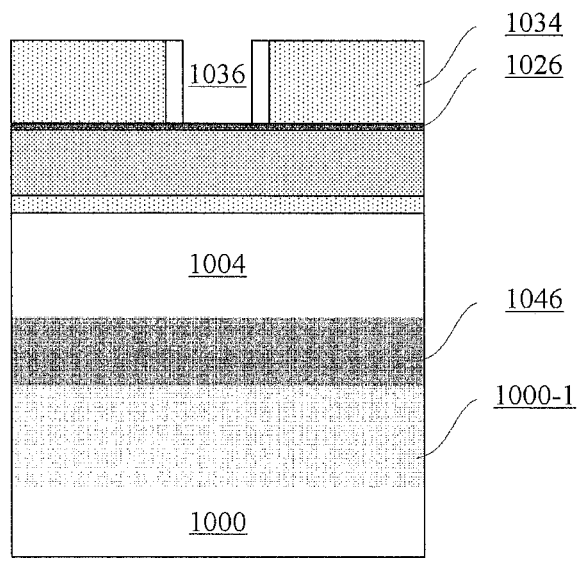
FIG. 23(b) is a schematic sectional view corresponding to FIG. 22(c)
Figure 24A:
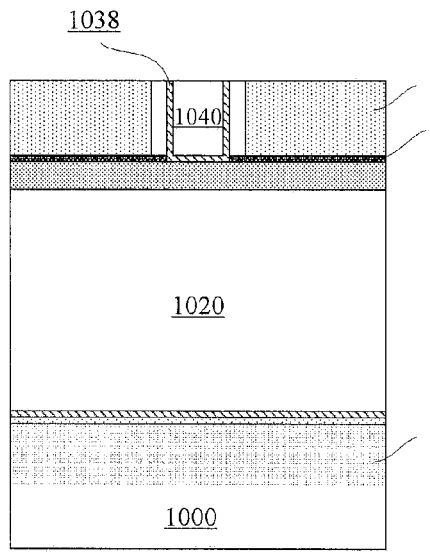
FIG. 24(a) is a schematic sectional view corresponding to FIG. 23(a)
Figure 24B:
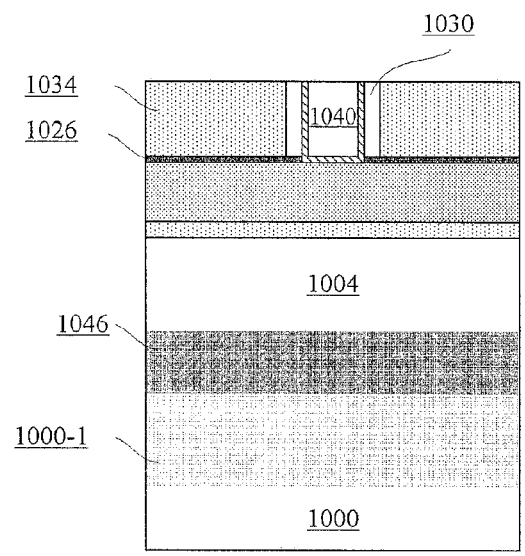
FIG. 24(b) is a schematic sectional view corresponding to FIG. 23(b)
Figure 24C:
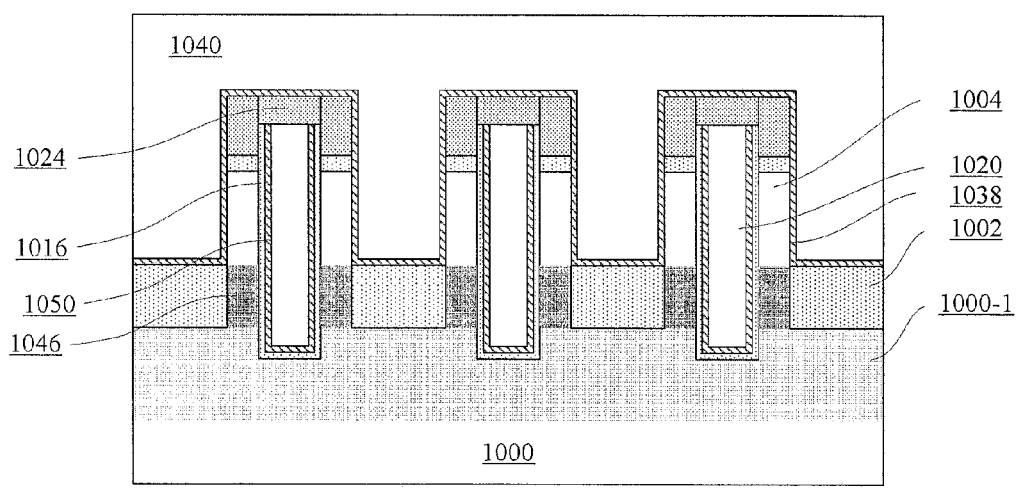
FIG. 24(c) is a schematic sectional view corresponding to FIG. 18.
Figure 25:
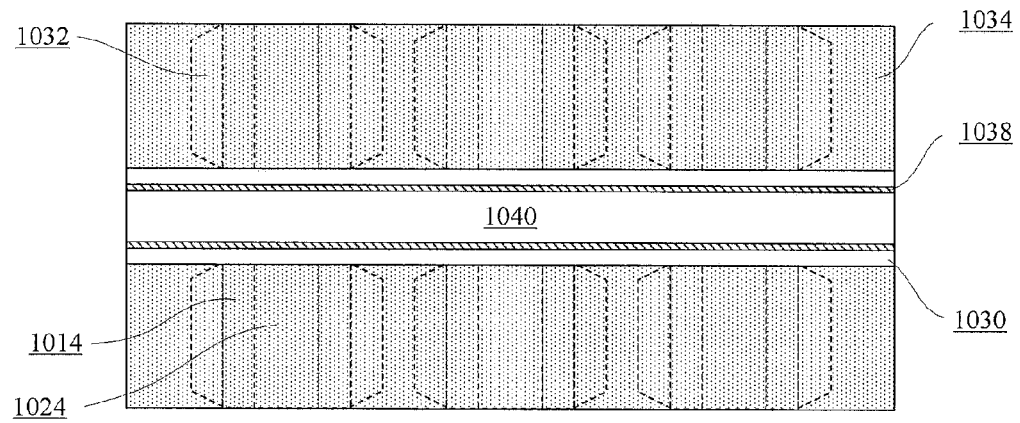
FIG. 25 is a schematic top view corresponding to FIG. 24(c)

Then, as shown in FIGS. 24(a)-24(c) (where FIGS. 24(a), 24(b), and 24(c) are sectional views corresponding to those of FIGS. 23(a), 23(b), and 18, respectively) and FIG. 25 (which is a top view showing the arrangement of FIG. 24), a final gate stack may be formed by forming a gate dielectric layer 1038 and a gate conductor layer 1040 in the gate groove. The gate dielectric layer 1038 may comprise a high-K gate dielectric material such as $HfO_2$, with a thickness of about 1-5 nm. Further, the gate dielectric layer 1038 may further comprise a thin oxide layer (on which the high-K gate dielectric is disposed), with a thickness of about 0.3-1.2 nm. The gate conductor layer 1040 may comprise a metal gate conductor. There may be a work function adjustment layer (not shown) interposed between the gate dielectric layer 1038 and the gate conductor layer 1040.

Thus, sFinFETs according to this embodiment are achieved. As shown in FIGS. 24 and 25, the sFinFET comprises the gate stack (including the gate dielectric layer 1038 and the gate conductor layer 1040) formed on the substrate 1000 (or on the isolation layer 1002) and intersecting the sFin (including the back gate 1020 and the fins 1004). As clearly shown in FIG. 24(c), the gate conductor layer 1040 may control generation of conductive channels in a side surface (opposite to the back gate 1020) of each of the fins 1004 via the gate dielectric layer 1038, resulting in a double-gate device. Further, due to the openings of the second dielectric layer 1050, the back gate 1020 and the thickness reduced portion of the back gate dielectric layer (specifically, the first dielectric layer 1016) can constitute a floating-gate configuration. The back gate 1020 may be electrically isolated from the gate stack by the dielectric layer 1024.

Figure 26:
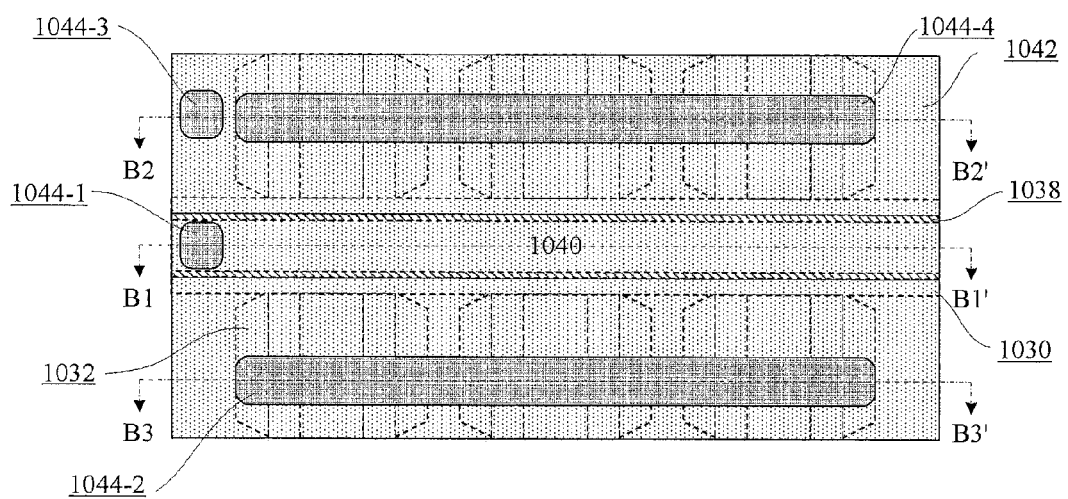
FIG. 26 is a schematic view of another stage of the manufacture of a memory device according to an embodiment of the present disclosure.

After formation of the sFinFETs, various electric contacts may be formed. For example, as shown in FIG. 26, an Interlayer Dielectric (ILD) layer 1042 may be formed on a surface of the arrangement of FIG. 25. The ILD layer 1042 may comprise oxide. The ILD layer 1042 may be planarized by, e.g., CMP, to have a substantially planar surface. Then, contact holes may be formed by means of, e.g., photolithography, and then filled by a conductive material, e.g., metal (such as W, Cu, or the like), to form contacts, such as a contact 1044-1 to the gate stack, a contact 1044-2 to one of the S/D regions, a contact 1044-3 to the well region 1000-1 (or, a back gate capacitor), and a contact 1044-4 to the other of the S/D regions.

Figure 27A:
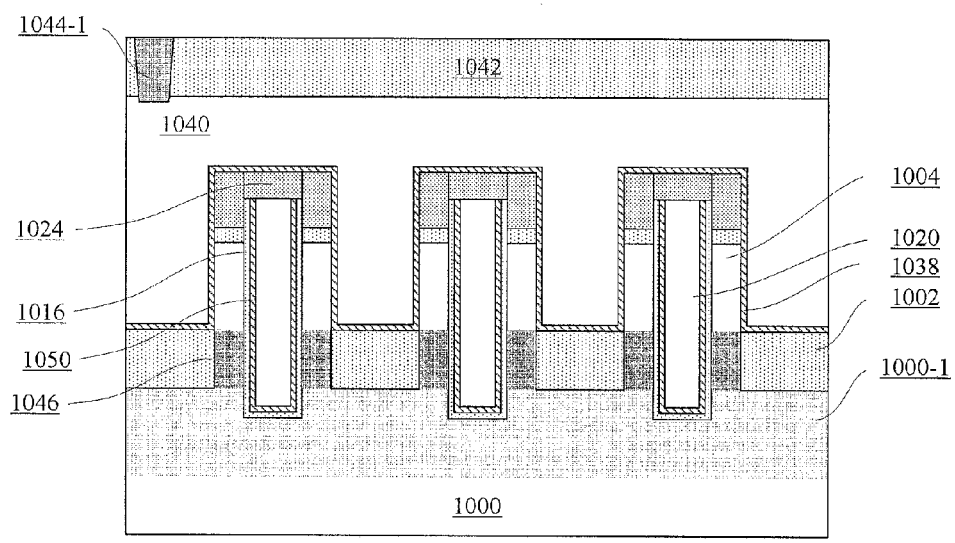
FIG. 27(a) is a schematic sectional view about lines B1-B1' of FIG. 26 showing another stage of the manufacture of a memory device according to an embodiment of the present disclosure.
Figure 27B:
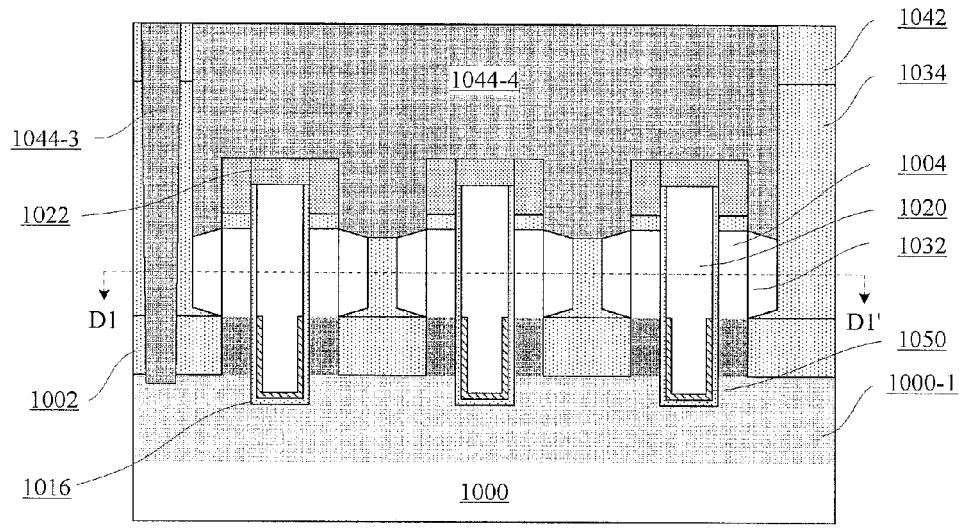
FIG. 27(b) is a schematic sectional view about lines B2-B2' of FIG. 26 showing another stage of the manufacture of a memory device according to an embodiment of the present disclosure.
Figure 27C:
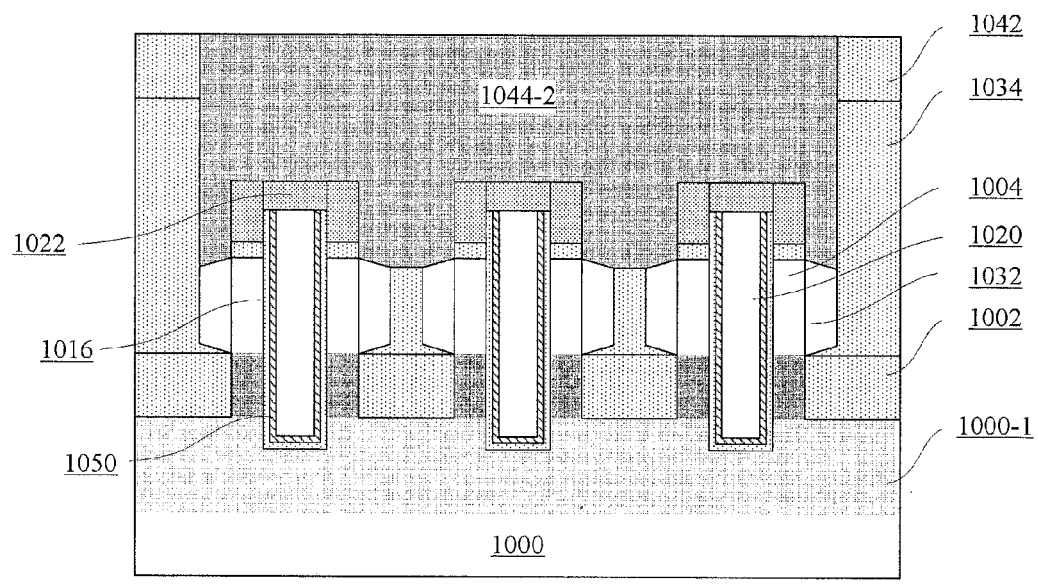
FIG. 27(c) is a schematic sectional view about lines B3-B3' of FIG. 26 showing another stage of the manufacture of a memory device according to an embodiment of the present disclosure.

FIGS. 27(a)-27(c) show sectional views taken along B1B1', B2B2', and B3B3' of FIG. 26 in (a), (b) and (c), respectively. As shown in FIG. 27(a), the contact 1044-1 passes through the ILD layer 1042, and accesses and thus is in electric contact with the gate conductor 1040. This contact 1044-1 may be connected to a word line of the memory device. The contact 1044-2 passes through the ILD layer 1042 and the dielectric layer 1034, and access and thus are in electric contact with the S/D region (the semiconductor layer 1032 in this example) on one side. The contacts 1044-2 may be connected to a bit line of the memory device. The contact 1044-3 passes through the ILD layer 1042, the dielectric layer 1034, and the isolation layer 1002, and accesses the substrate 1000 (especially, the well region 1000-1 therein) and thus is in electric contact with the back gate capacitor. The contact 1044-4 passes through the ILD layer 1042 and the dielectric layer 1034, and access and thus are in electric contact with the S/D region (the semiconductor layer 1032 in this example) on the other side. Electrical signals required for operations, such as read and write, of the memory device may be applied through those electrical contacts.

Figure 28:
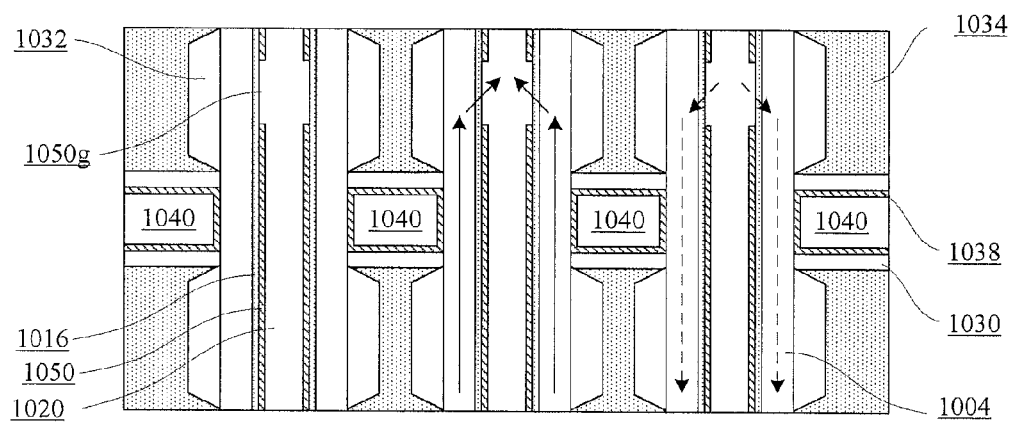
FIG. 28 is a schematic sectional view about lines D1-D' of FIG. 27(b) showing another stage of the manufacture of a memory device according to an embodiment of the present disclosure.

Hereinafter, a general principle of operating the memory device according to the embodiment of the present disclosure will be described in conjunction with FIG. 28 (a sectional view taken along line D1D1' in FIG. 27(b)).

When the memory device (specifically, the sFinFET therein) is turned on by applying an ON voltage to the gate 1040 through the contact 1044-1, there may be carriers (majority carriers of the device, for example, electrons for an n-type device and holes for a p-type device) flowing from the source to the drain if a bias (referred to as "a first bias" hereinafter) is applied to the source through the contact 1044-2. If the contact 1044-4 is electrically floating, the carriers can tunnel into and thus be stored in the back gate 1020 (or the back gate capacitor) through the first dielectric layer 1016 at the openings 1050g of the second dielectric layer 1050, as shown by solid arrows in FIG. 28. At other positions than the openings 1050g, there is substantially no tunneling due to the presence of both the second dielectric layer 1050 and the first dielectric layer 1016. In those operations, the contact 1044-3 may be grounded.

On the other hand, when the memory device (specifically, the sFinFET therein) is turned on by applying the ON voltage to the gate 1040 through the contact 1044-1, charges stored in the back gate 1020 (or the back gate capacitor), if present, can tunnel through the first dielectric layer 1016 at the openings 1050g of the second dielectric layer 1050 and thus be pulled out from the back gate if a bias (referred to as "a second bias" hereinafter, for example, a voltage greater than or equivalent to a supply voltage Vdd for the drain) is applied to the source through the contact 1044-2, as shown by dashed arrows in FIG. 28. Thus, the back gate is discharged. In those operations, the contact 1044-3 may be grounded.

As a result, the memory device can store at least two states: one is a state where the back gate has charges stored therein (which can be assumed as logic "1," for example, and the other is a state where the back gate has substantially no charges stored therein (which can be assumed as logic "0," for example). Presence or absence of the charges in the back gate will impact a threshold voltage of the sFinFET (for example, for an n-type device, the threshold voltage Vt1 of the sFinFET in a case where the back gate has electrons stored therein is greater than the threshold voltage Vt2 of the sFinfET in a case where the back gate has no electrons stored therein), and thus the sFinFET can present different electric characteristics. The states stored in the memory device may be detected based on differences of the electric characteristics.

For example, the memory device can be read as follows. Specifically, a voltage V1 may be applied to the drain through the contact 1044-2. A bias may be applied through the contact 1044-1 to turn the sFinFET off, and the bit line may be precharged to a voltage V2 different from V1. Then, a bias may be applied through the contact 1044-1 to turn the sFinFET on. At this time, the voltage on the bit line will approach from V2 to V1. A rate of approaching of the voltage on the bit line from V2 to V1 depends on the threshold voltage of the sFinFET (Vt1 or Vt2). For example, for an n-type device, the threshold voltage Vt1 in the state of logic "1" is relatively high, and the threshold voltage Vt2 is the state of logic "0" is relatively low. Therefore, the rate of approaching of the voltage on the bit line from V2 to V1 is relatively slow in the state of logic "1," and the rate of approaching of the voltage on the bit line from V2 to V1 is relatively fast in the state of logic "0." The state (or, "data") stored in the memory device can be detected by detecting the difference in this rate.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A memory device, comprising:
a substrate;
a back gate, which is formed on the substrate and extends in a first direction;
a transistor, comprising fins, which are formed on opposite sides of the back gate on the substrate, respectively, and extend in the first direction with the back gate disposed therebetween, and a gate stack, which is formed on the substrate and extends in a second direction crossing the first direction and thus intersects the fins; and
a back gate dielectric layer, which is formed on the side and bottom surfaces of the back gate so that the back gate is electrically floating,
wherein in the first direction, the back gate dielectric layer has a first end region on one side with respect to the gate stack and a second end region, opposite to the first end region, on an opposing side with respect to the gate stack; and,
wherein the back gate dielectric layer has a portion facing the fins on one of the first end region and the second end region and reduced in thickness than remaining portions of the back gate dielectric layer.

2. The memory device according to claim 1, wherein the back gate dielectric layer comprises a first dielectric layer and a second dielectric layer formed sequentially on the side and bottom surfaces of the back gate, wherein the first dielectric layer has an opening at said one region where the thickness reduced portion is.

3. The memory device according to claim 2, wherein the first dielectric layer and the second dielectric layer each comprise high-K dielectrics.

4. The memory device according to claim 2, wherein one of the first and second dielectric layers comprises high-K dielectrics and the other of the first and second dielectric layers comprises oxide.

5. The memory device according to claim 4, wherein the first dielectric layer comprises high-K dielectrics with a thickness of about 2-25 nm, and the second dielectric layer comprises oxide with a thickness of about 1-3 nm.

6. The memory device according to claim 1, wherein the substrate comprises a well region, wherein the back gate extends into the well region by a depth of about 20-300 nm.

7. The memory device according to claim 1, wherein the back gate has a top surface substantially flush with or higher than that of each of the fins.

8. The memory device according to claim 1, wherein the back gate comprises a conductive material, with a width of about 5-30 nm.

9. The memory device according to claim 1, wherein the fin comprises any of Si, Ge, SiGe, GaAs, GaSb, AlAs, InAs, InP, GaN, SiC, InGaAs, InSb, or InGaSb, with a width of about 3-28 nm.

10. The memory device according to claim 1, further comprising:
an isolation layer formed on the substrate and exposing a portion of each of the fins, wherein the gate stack is electrically isolated from the substrate by the isolation layer; and
a punch-through stopper formed beneath the portions of the fins exposed by the isolation layer.

11. The memory device according to claim 1, wherein the gate stack defines a channel region in each of the fins, and the transistor further comprises source and drain regions on opposite sides of the channel region, wherein the thickness reduced portion is disposed on the same side as the drain region with respect to the gate stack.

12. The memory device according to claim 11, wherein the source and drain regions each further comprise a semiconductor layer grown on surfaces of portions of each of the fins on opposite sides with respect to the gate stack.

13. A method of manufacturing a memory device, comprising the steps of:
forming a back gate groove in a substrate;
forming a back gate dielectric layer on side and bottom walls of the back gate groove;
forming a back gate by filling a conductive material into the back gate groove;
exposing a portion of the back gate dielectric layer by selectively removing a portion of the back gate at one end of the back gate groove, reducing the exposed portion of the back gate dielectric layer in thickness, and then refilling a further conductive material into the back gate groove;
forming fins abutting the back gate dielectric layer by patterning the substrate; and
forming a gate stack on the substrate to intersect the fins, wherein the portion of the back gate dielectric layer which is reduced in thickness is disposed on one side of the gate stack and faces the fins.

14. The method according to claim 13, wherein the step of forming the back gate dielectric layer comprises the step of:
sequentially forming a first dielectric layer and a second dielectric layer on the side and bottom walls of the back gate groove, and
wherein reducing the exposed portion of the back gate dielectric layer in thickness comprises the step of:
selectively removing an exposed portion of the second dielectric layer.

15. The method according to claim 13, wherein the gate stack defines a channel region in each of the fins, and the method further comprises the step of forming source and drain regions on opposite sides of the channel region, wherein the thickness reduced portion is disposed on the same side as the drain region.

16. The method according to claim 13, wherein forming the back gate groove comprises the steps of:
forming a patterning auxiliary layer on the substrate and patterning the patterning auxiliary layer to have an opening at a position corresponding to the back gate groove;
forming a pattern transfer layer on side walls of the patterning auxiliary layer facing the opening;

forming the back gate groove by etching the substrate with the patterning auxiliary layer and the pattern transfer layer as a mask, and wherein forming the fins comprises the steps of:

selectively removing the patterning auxiliary layer; and forming the fins by etching the substrate with the pattern transfer layer as a mask.

17. The method according to claim 16, wherein the substrate comprises any of Si, Ge, SiGe, GaAs, GaSb, AlAs, InAs, InP, GaN, SiC, InGaAs, InSb, or InGaSb, and the patterning auxiliary layer comprises amorphous silicon, and wherein the method further comprises the step of forming a protection layer on a top surface of the patterning auxiliary layer to protect the patterning auxiliary layer during the etching of back gate groove.

18. The method according to claim 17, further comprising the step of forming a stop layer on the substrate, on which the patterning auxiliary layer is disposed.

19. The method according to claim 18, wherein the protection layer comprises nitride, the pattern transfer layer comprises nitride, and the stop layer comprises oxide.

20. The method according to claim 16, wherein the pattern transfer layer is formed on the side walls of the patterning auxiliary layer in a spacer formation process.

21. A method of accessing the memory device according to claim 1, comprising the steps of:

applying an ON voltage through a word line to turn on the transistor, electrically floating a drain of the transistor, and applying a first bias to a source of the transistor through a bit line, so that carriers flow from the source to the drain and tunnel into and thus are stored in the back gate through the thickness reduced portion of the back gate dielectric layer, to store a first state in the memory device; and applying the ON voltage through the word line to turn on the transistor, electrically floating the drain of the transistor, and applying a second bias to the source of the transistor through the bit line, so that the carriers stored in the back gate tunnel through the thickness reduced portion of the back gate dielectric layer and thus are released, to store a second state in the memory device, wherein the transistor has a threshold voltage in the first state different from that in the second state.

22. The method according to claim 21, wherein the step of tunneling comprises one of direct tunneling and Fowler-Nordheim tunneling.

23. The method according to claim 21, further comprising the steps of:

applying a voltage V1 to the drain;

turning off the transistor;

precharging the bit line to a voltage V2 different from the voltage V1; and applying a bias to the word line to turn on the transistor, and detecting a rate of approaching of the voltage on the bit line from V2 to V1.

24. The method according to claim 23, wherein the transistor is an n-type device, and the rate of approaching of the voltage on the bit line from V2 to V1 is relatively slow in the first state, while relatively fast in the second state.

* * * * *